(12) United States Patent
Park et al.

(10) Patent No.: US 11,502,139 B2
(45) Date of Patent: Nov. 15, 2022

(54) DISPLAY DEVICE AND METHOD OF MANUFACTURING THE SAME

(71) Applicant: Samsung Display Co., Ltd., Yongin-si (KR)

(72) Inventors: Sungkyun Park, Yongin-si (KR); Yejoo Jun, Yongin-si (KR); Jungmoo Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 197 days.

(21) Appl. No.: 16/888,226

(22) Filed: May 29, 2020

(65) Prior Publication Data
US 2021/0005676 A1  Jan. 7, 2021

(30) Foreign Application Priority Data
Jul. 5, 2019  (KR) .................. 10-2019-0081601

(51) Int. Cl.
*H01L 27/32* (2006.01)
*H01L 51/52* (2006.01)
*H01L 51/56* (2006.01)

(52) U.S. Cl.
CPC ........ *H01L 27/323* (2013.01); *H01L 27/3276* (2013.01); *H01L 51/5253* (2013.01); *H01L 51/5284* (2013.01); *H01L 51/56* (2013.01); *H01L 2251/301* (2013.01)

(58) Field of Classification Search
CPC ............. H01L 27/323; H01L 27/3276; H01L 51/5253; H01L 51/5284; H01L 51/56; H01L 2251/301; H01L 27/3246; H01L 27/3248; H01L 27/3272; H01L 27/3279; H01L 27/3258; G06F 2203/04102; G06F 2203/04103; G06F 3/0412; G06F 3/04164; G06F 3/0446; G06F 2203/04112
See application file for complete search history.

(56) References Cited

U.S. PATENT DOCUMENTS

| | | |
|---|---|---|
| 2011/0139516 A1 | 6/2011 | Nirmal et al. |
| 2018/0175116 A1 | 6/2018 | Song et al. |
| 2018/0232090 A1 | 8/2018 | Yoon et al. |
| 2018/0246599 A1 | 8/2018 | Choi et al. |
| 2018/0331160 A1 | 11/2018 | Beak et al. |

(Continued)

FOREIGN PATENT DOCUMENTS

| | | |
|---|---|---|
| EP | 2513764 A1 | 10/2012 |
| KR | 10-2018-0070218 A | 6/2018 |

(Continued)

*Primary Examiner* — Kyoung Lee
(74) *Attorney, Agent, or Firm* — Lewis Roca Rothgerber Christie LLP

(57) ABSTRACT

A display device includes: a substrate including a display area and a non-display area; and a touch unit on the substrate, wherein the touch unit includes: a first inorganic insulating layer in the display area; a first conductive layer on the first inorganic insulating layer; a first organic layer on the first conductive layer; a second conductive layer on the first organic layer and electrically connected to the first conductive layer through a first contact hole in the first organic layer; and a second organic layer on the second conductive layer so as to cover a lateral surface and a top surface of the second conductive layer and including a photosensitive material.

19 Claims, 15 Drawing Sheets

(56) References Cited

U.S. PATENT DOCUMENTS

| | | |
|---|---|---|
| 2019/0097171 A1 | 3/2019 | Park |
| 2019/0103443 A1* | 4/2019 | Kim ..................... G06F 3/0412 |
| 2019/0278410 A1 | 9/2019 | Kim et al. |

FOREIGN PATENT DOCUMENTS

| | | |
|---|---|---|
| KR | 10-2018-0094596 A | 8/2018 |
| KR | 10-2018-0099075 A | 9/2018 |
| KR | 10-2018-0124607 A | 11/2018 |
| KR | 10-2019-0034386 A | 4/2019 |

\* cited by examiner

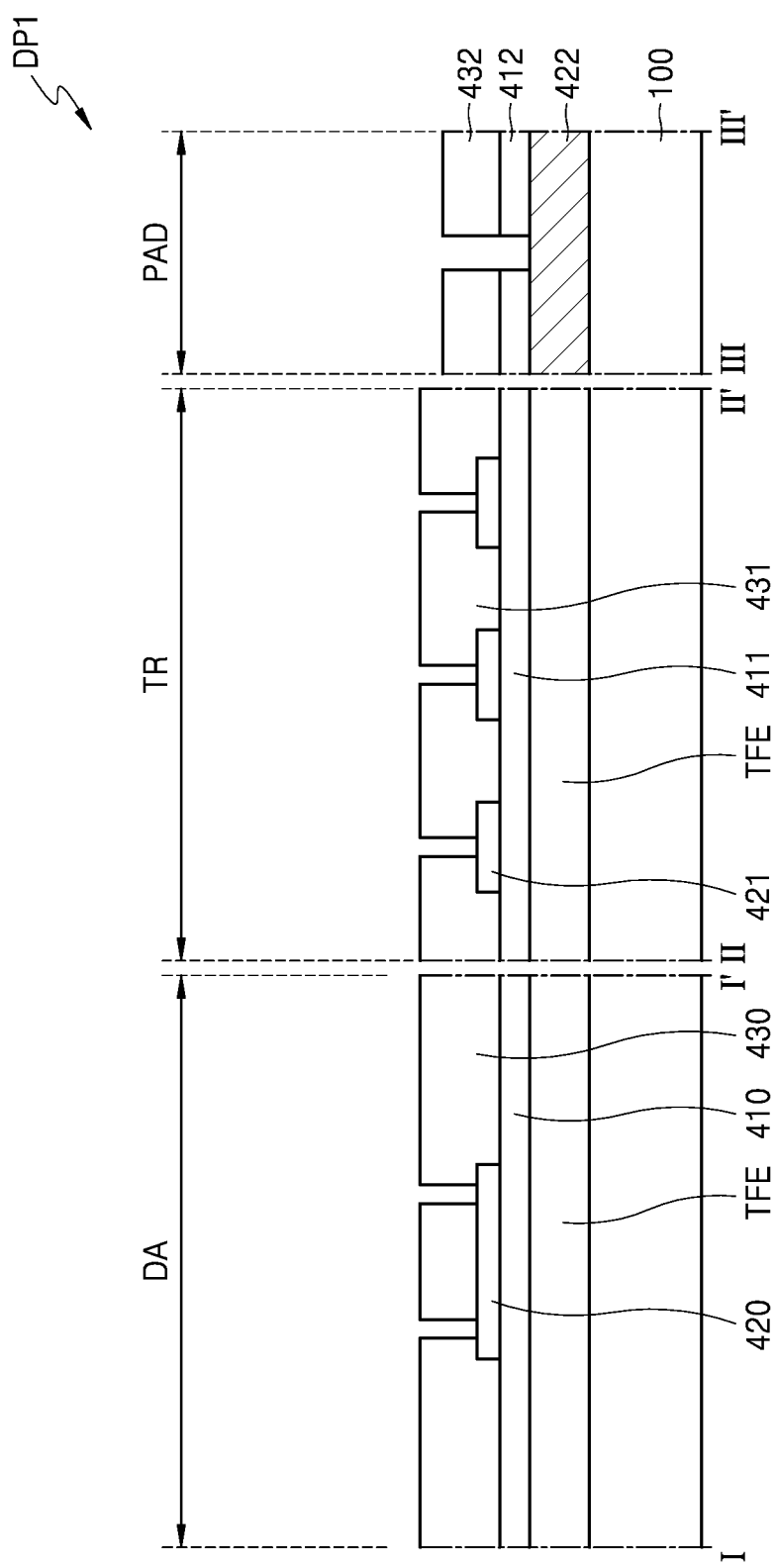

DISPLAY DEVICE AND METHOD OF MANUFACTURING THE SAME

CROSS-REFERENCE TO RELATED APPLICATION

The present application claims priority to and the benefit of Korean Patent Application No. 10-2019-0081601, filed on Jul. 5, 2019, in the Korean Intellectual Property Office, the disclosure of which is incorporated herein in its entirety by reference.

BACKGROUND

1. Field

Aspects of one or more example embodiments relate to a display device and a method of manufacturing the same.

2. Description of Related Art

Because an organic light-emitting display device has not only a wide viewing angle and excellent contrast, but also fast response speeds among display devices, the organic light-emitting display device is in the limelight as a next-generation display device.

A display device may be activated by receiving an electrical signal. A display device may include an input sensing unit that senses various types of inputs applied from the outside (e.g., an external input source). Among input sensing units, a touch unit may be applied to a display panel that displays an image and may improve user convenience.

The above information disclosed in this Background section is only for enhancement of understanding of the background and therefore the information discussed in this Background section does not necessarily constitute prior art.

SUMMARY

Aspects of one or more example embodiments relate to a display device and a method of manufacturing the same, and for example, to a display device having an improved reliability of a product and a method of manufacturing the display device.

When a strip process is performed on a display device in a related art manufacturing process, an organic layer arranged between conductive layers of a touch unit may be damaged by a stripper and the performance of the touch unit may be deteriorated.

Thus, one or more example embodiments include a display device having a relatively improved performance of a touch unit by preventing or reducing damage to an organic layer, and a method of manufacturing the display device. However, it should be understood that embodiments described herein should be considered in a descriptive sense only and not for limitation of the disclosure.

Additional aspects will be set forth in part in the description which follows and, in part, will be more apparent from the description, or may be learned by practice of the presented example embodiments of the disclosure According to one or more example embodiments, a display device includes: a substrate including a display area and a non-display area; and a touch unit on the substrate, wherein the touch unit includes: a first inorganic insulating layer in the display area; a first conductive layer on the first inorganic insulating layer; a first organic layer on the first conductive layer; a second conductive layer on the first organic layer and electrically connected to the first conductive layer through a first contact hole defined in the first organic layer; and a second organic layer on the second conductive layer so as to cover a lateral surface and a top surface of the second conductive layer and including a photosensitive material.

According to some example embodiments, the non-display area may include a wiring area and a pad area each on one side of the display area, and the display device may further include: a first layer arranged in the wiring area; a first wiring layer arranged on the first layer and including the same material as that of the first conductive layer; a second layer on the first wiring layer; a second wiring layer arranged on the second layer so as to be electrically connected to the first wiring layer through a second contact hole defined in the second layer and including the same material as that of the second conductive layer; and a third layer arranged on the second wiring layer so as to cover a lateral surface and a top surface of the second wiring layer and including a photosensitive material.

According to some example embodiments, the display device may further include: a bottom conductive layer in the pad area; a first layer on the bottom conductive layer; a second layer on the first layer; and a top conductive layer electrically connected to the bottom conductive layer through a third contact hole defined in the first layer and the second layer and including the same material as that of the second conductive layer.

According to some example embodiments, a refractive index of the first organic layer may be different from a refractive index of the second organic layer.

According to some example embodiments, the second organic layer may include a light-blocking material.

According to some example embodiments, the display device may further include: a light-emitting element arranged between the substrate and the touch unit in the display area and including a pixel electrode, an opposite electrode, and an intermediate layer, the opposite electrode being over the pixel electrode, and the intermediate layer including an emission layer arranged between the pixel electrode and the opposite electrode; and a thin-film encapsulation layer arranged on the light-emitting element and including at least one inorganic encapsulation layer and at least one organic encapsulation layer.

According to some example embodiments, the touch unit may be directly arranged on the thin-film encapsulation layer.

According to one or more example embodiments, a display device includes: a substrate including a display area and a non-display area; and a touch unit arranged on the substrate, wherein the touch unit includes: a first inorganic insulating layer in the display area; a first conductive layer on the first inorganic insulating layer; a first organic layer on the first conductive layer; a second conductive layer arranged on the first organic layer and electrically connected to the first conductive layer through a first contact hole defined in the first organic layer; a second organic layer arranged on the second conductive layer so as to cover a top surface of the second conductive layer, having a lateral surface located on the same plane as a lateral surface of the second conductive layer, and including a photosensitive material; and a third organic layer on the second organic layer.

According to some example embodiments, the non-display area may include a wiring area and a pad area each on one side of the display area, and the display device may further include: a first layer arranged in the wiring area; a first wiring layer arranged on the first layer and including the same material as that of the first conductive layer; a second layer on the first wiring layer; a second wiring layer arranged on the second layer so as to be electrically connected to the first wiring layer through a second contact hole defined in the second layer, and including the same material as that of the second conductive layer; a third layer arranged on the second wiring layer so as to cover a top surface of the second wiring layer, having a lateral surface located on the same plane as a lateral surface of the second wiring layer, and including a photosensitive material; and a fourth insulating layer on the third layer.

According to some example embodiments, the display device may further include: a bottom conductive layer in the pad area; a first layer on the bottom conductive layer; a second layer on the first layer; and a top conductive layer electrically connected to the bottom conductive layer through a third contact hole defined in the first layer and the second layer and including the same material as that of the second conductive layer.

According to some example embodiments, a refractive index of the first organic layer, a refractive index of the second organic layer, and a refractive index of the third organic layer may be different from one another.

According to some example embodiments, the second organic layer may include a light-blocking material.

According to some example embodiments, the display device may further include: a light-emitting element arranged between the substrate and the touch unit in the display area and including a pixel electrode, an opposite electrode, and an intermediate layer, the opposite electrode being on the pixel electrode, and the intermediate layer including an emission layer arranged between the pixel electrode and the opposite electrode; and a thin-film encapsulation layer arranged on the light-emitting element and including at least one inorganic encapsulation layer and at least one organic encapsulation layer.

According to some example embodiments, the touch unit may be directly arranged on the thin-film encapsulation layer.

According to one or more example embodiments, a method of manufacturing a display device includes: preparing a substrate including a display area, a wiring area, and a pad area, the wiring area and the pad area being located one side of the display area; forming a bottom conductive layer in the pad area; forming a first inorganic insulating layer in the display area, a first insulating layer in the wiring area, and a first layer on the bottom conductive layer; forming a first conductive layer on the first inorganic insulating layer and a first wiring layer on the first layer; forming a first organic layer on the first conductive layer, a second layer on the first wiring layer, and a second layer on the first layer; forming a first conductive material layer on the first organic layer, a second conductive material layer on the second layer, and a third conductive material layer on the second layer; patterning a second organic layer including a photosensitive material on the first conductive material layer, a third layer including a photosensitive material on the second conductive material layer, and a third layer including a photosensitive material on the third conductive material layer; patterning the first conductive material layer, the second conductive material layer, and the third conductive material layer respectively using the second organic layer, the third layer, and the third layer as photoresists to form a second conductive layer, a second wiring layer, and a top conductive layer; and removing the third layer.

According to some example embodiments, the method may further include: after the removing of the third layer, reflowing the second organic layer such that the second organic layer covers a lateral surface of the second conductive layer, and reflowing the third layer such that the third layer covers a lateral surface of the second wiring layer through a curing process.

According to some example embodiments, the method may further include: after the removing of the third layer, forming a third organic layer on the second organic layer and forming a fourth insulating layer on the third layer.

According to some example embodiments, a refractive index of the first organic layer, a refractive index of the second organic layer, and a refractive index of the third organic layer may be different from one another.

According to some example embodiments, the second organic layer may include a light-blocking material.

According to some example embodiments, in the forming of the second conductive layer and the second organic layer, forming the second wiring layer and the third layer, and forming the top conductive layer and the third layer, the second organic layer may have a first thickness from a top surface of the second conductive layer and the third layer may have a second thickness from a top surface of the top conductive layer, the second thickness being less than the first thickness.

The above and other aspects, features, and characteristics of certain example embodiments of the disclosure will be more apparent from the following description, claims, and the accompanying drawings.

BRIEF DESCRIPTION OF THE DRAWINGS

The above and other aspects, features, and characteristics of certain example embodiments of the disclosure will be more apparent from the following description taken in conjunction with the accompanying drawings, in which:

FIGS. 11A to 11E are cross-sectional views of some of a method of manufacturing a display device, according to some example embodiments.

DETAILED DESCRIPTION

Figure 1:
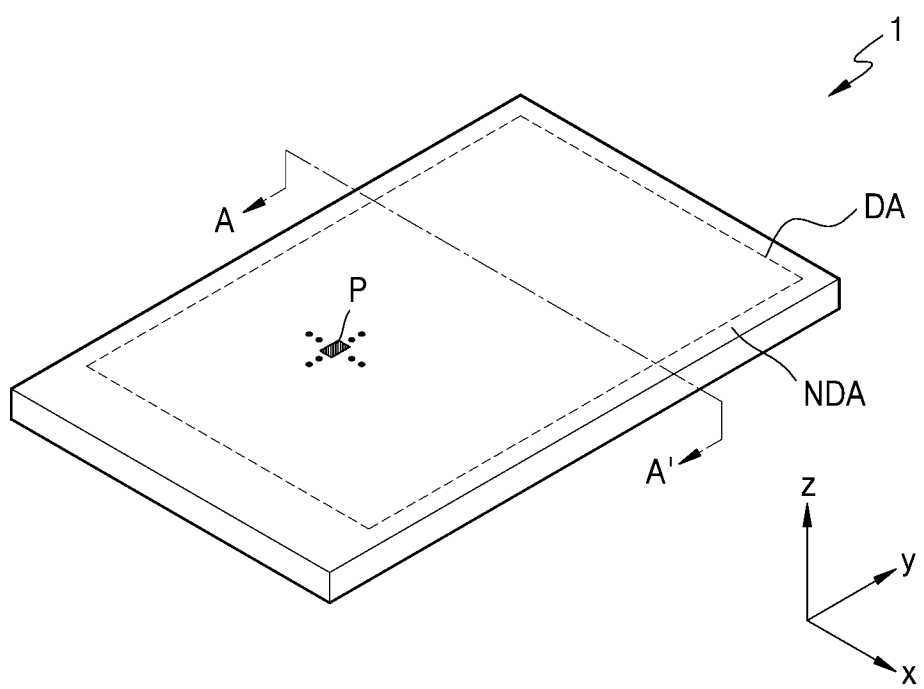
FIG. 1 is a perspective view of a display device according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a perspective view of a display device 1 according to some example embodiments.

Referring to FIG. 1, the display device 1 includes a display area DA in which an image is displayed and a non-display area NDA in which an image is not displayed. The display device 1 may display an image by using light emitted from a plurality of pixels P arranged in the display area DA. The non-display area NDA is an area in which an image is not displayed.

Though the display device 1 according to some example embodiments is described as an organic light-emitting display device as an example, a display device according to the present disclosure is not limited thereto. According to some example embodiments, the display device 1 according to the present disclosure may be various ones, for example, an inorganic light-emitting display and a quantum dot light-emitting display. For example, an emission layer of a display element provided to the display device 1 may include an organic material, an inorganic material, quantum dots, an organic material and quantum dots, or an inorganic material and quantum dots.

Though FIG. 1 shows the display device 1 including a flat display surface, the embodiments are not limited thereto. According to some example embodiments, the display device 1 may include a three-dimensional display surface or a curved display surface.

In the case where the display device 1 includes a three-dimensional display surface, the display device 1 may include a plurality of display areas indicating different directions, for example, a polyprism-type display surface. According to some example embodiments, in the case where the display device 1 includes a curved display surface, the display device 1 may be various ones, for example, a flexible display device, a foldable display device, and a roll-able display device.

Also, according to some example embodiments, as illustrated in FIG. 1, the display device 1 may be utilized in a mobile phone terminal. According to some example embodiments, electronic modules, a camera module, a power module, etc. mounted on a mainboard may be arranged on a bracket/case together with the display device 1 to constitute a mobile phone terminal. The display device 1 according to some example embodiments may be utilized in various suitable large-scale electronic apparatuses, according to the design of the display device 1, such as televisions and monitors, and small and medium-scale electronic apparatuses such as tablets, navigation apparatuses for an automobile, game consoles, and smartwatches.

Though it is shown in FIG. 1 that the display area DA of the display device 1 is a quadrangle, a shape of the display area DA may be a circle, an ellipse, or a polygon such as a triangle or a pentagon according to some example embodiments.

The display device 1 according to some example embodiments may include a display unit DU (that is, a display layer), a touch unit TU, a polarization unit PU, and a window unit WU. At least some elements of the display unit DU, the touch unit TU, the polarization unit PU, and the window unit WU may be formed by a successive process, or coupled to each other by an adhesive member.

Figure 2:
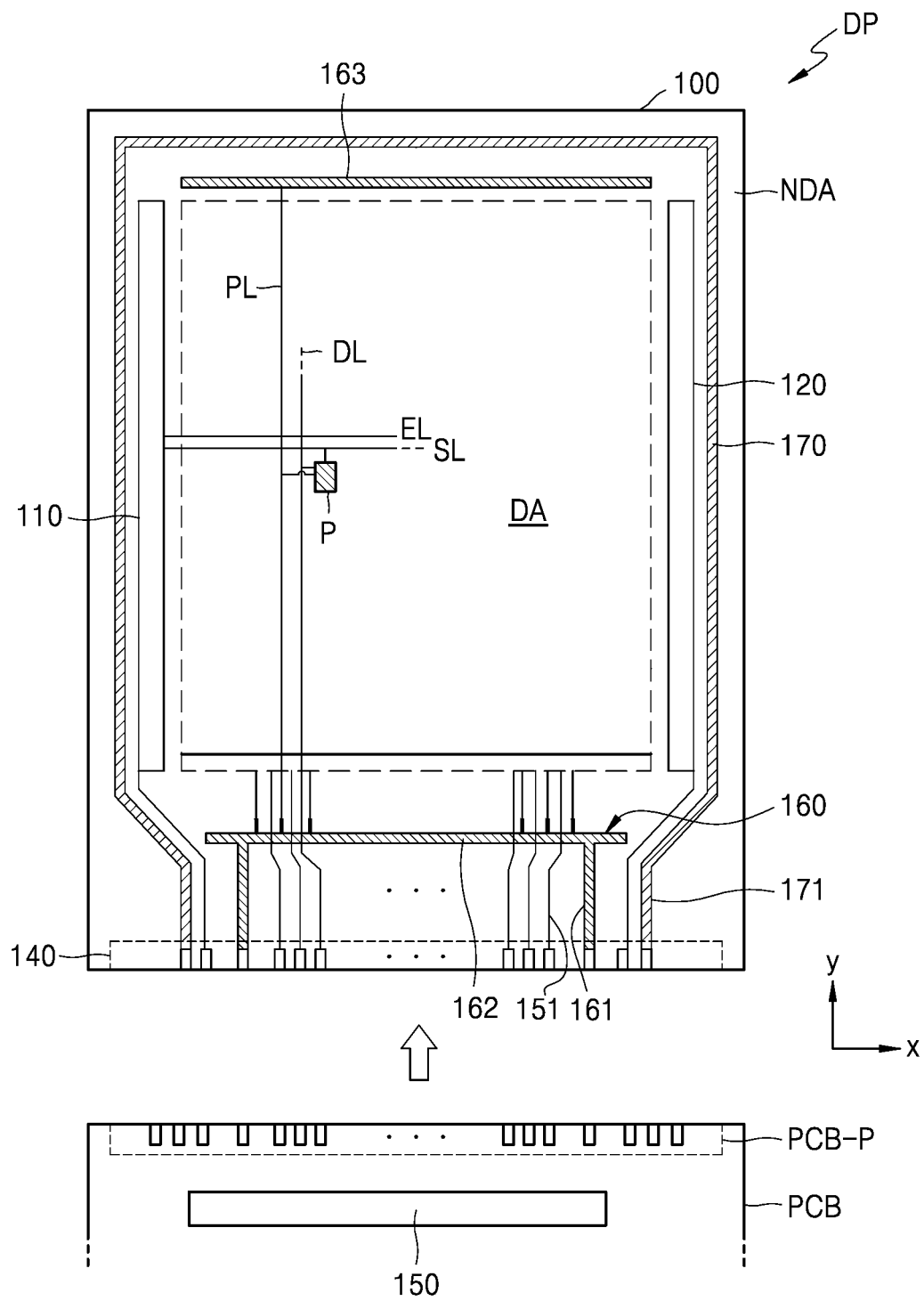
FIG. 2 is a plan view of a portion of a display device according to some example embodiments.

FIG. 2 is a plan view of a portion of the display device 1 according to some example embodiments.

Referring to FIG. 2, a display panel DP includes a plurality of pixels P arranged in the display area DA. Although only a single pixel P is illustrated in certain figures for convenience of illustration and description, a person having ordinary skill in the art would understand that the display device 1 according to various embodiments includes a plurality of pixels P.

The plurality of pixels P each may include a display element such as an organic light-emitting diode OLED. Each pixel P may emit, for example, red, green, blue, or white light from an organic light-emitting diode OLED. In the present specification, a pixel P may be a pixel that emits one of red, green, blue, and white light colors. The display area DA may be covered by a thin-film encapsulation layer TFE (see FIG. 6) and thus protected from external air or moisture.

Each pixel P may be electrically connected to peripheral circuits arranged in the non-display area NDA. For example, a first scan driving circuit 110, a second scan driving circuit 120, a pad unit 140, a data driving circuit 150, a first power supply line 160, and a second power supply line 170 may be arranged in the non-display area NDA and connected (directly or indirectly) to the pixels P.

The first scan driving circuit 110 may provide a scan signal to each pixel P through a corresponding scan line SL. The first scan driving circuit 110 may provide an emission control signal to each pixel P through a corresponding emission control line EL. The second scan driving circuit 120 may be arranged in parallel to the first scan driving circuit 110 with the display area DA therebetween. Some of the pixels P arranged in the display area DA may be electrically connected to the first scan driving circuit 110, and the rest of the pixels P may be connected to the second scan driving circuit 120. According to some example embodiments, the second scan driving circuit 120 may be omitted.

The pad unit 140 may be arranged on one side of the substrate 100. The pad unit 140 may be exposed by not being covered with an insulating layer and thus may be electrically connected to a printed circuit board PCB. A pad unit PCB-P of the printed circuit board PCB may be electrically connected to the pad unit 140 of the display device 1. The printed circuit board PCB transfers a signal or power of a controller to the display device 1.

A control signal generated by the controller may be transferred to each of the first scan driving circuit 110 and the second scan driving circuit 120 through the printed circuit board PCB. The controller may provide a first power voltage ELVDD and a second power voltage ELVSS to the first power supply line 160 and the second power supply line 170, respectively, through a first connection line 161 and a second connection line 171. The first power voltage ELVDD may be provided to each pixel P through a driving voltage line PL connected to the first power supply line 160, and the second power voltage ELVSS may be provided to an opposite electrode of each pixel P connected to the second power supply line 170.

The data driving circuit 150 is electrically connected to a data line DL. A data signal of the data driving circuit 150 may be provided to each pixel P through a connection line 151 connected to the pad unit 140 and the data line DL connected to the connection line 151. Though it is shown in FIG. 2 that the data driving circuit 150 is arranged on the printed circuit board PCB, the data driving circuit 150 may be arranged on the substrate 100 according to some example embodiments. For example, the data driving circuit 150 may be arranged between the pad unit 140 and the first power supply line 160.

The first power supply line 160 may include a first sub-line 162 and a second sub-line 163 extending in an x-direction in parallel to each other with the display area DA therebetween. The second power supply line 170 has a loop shape having one open side and may partially surround the display area DA.

Figure 3:
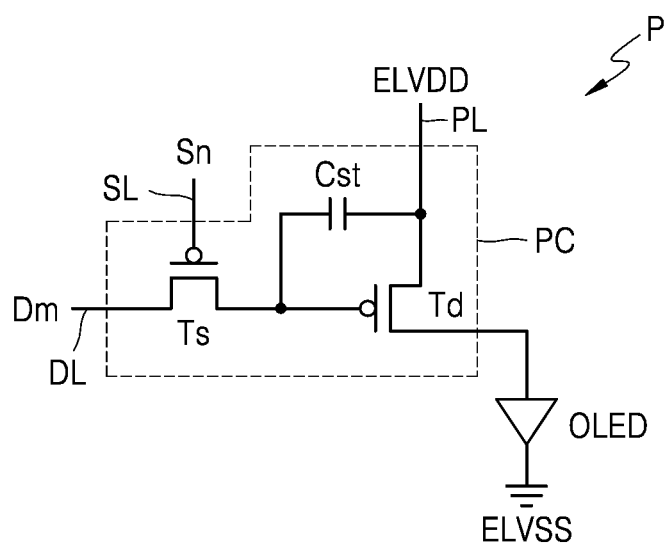
FIG. 3 is an equivalent circuit diagram of a pixel that may be included in a display device according to some example embodiments.

FIG. 3 is an equivalent circuit diagram of a pixel that may be included in the display device 1 according to some example embodiments.

Referring to FIG. 3, each pixel P includes a pixel circuit PC and an organic light-emitting diode OLED, the pixel circuit PC being connected to a scan line SL and a data line DL, and the organic light-emitting diode OLED being connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL and transfers a data signal Dm input through the data line DL to the driving thin film transistor Td in response to a scan signal Sn input through the scan line SL.

The storage capacitor Cst is connected to the switching thin film transistor Ts and the driving voltage line PL and stores a voltage corresponding to a difference between a voltage transferred from the switching thin film transistor Ts and the first power voltage ELVDD (or a driving voltage).

The driving thin film transistor Td is connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a brightness (e.g., a set or predetermined brightness) by using the driving current.

Though it is shown in FIG. 3 that the pixel circuit PC includes two thin film transistors and one storage capacitor, the embodiments are not limited thereto. For example, the pixel circuit PC may include seven thin film transistors and one storage capacitor. According to some example embodiments, the pixel circuit PC may include two or more storage capacitors.

Figure 4:
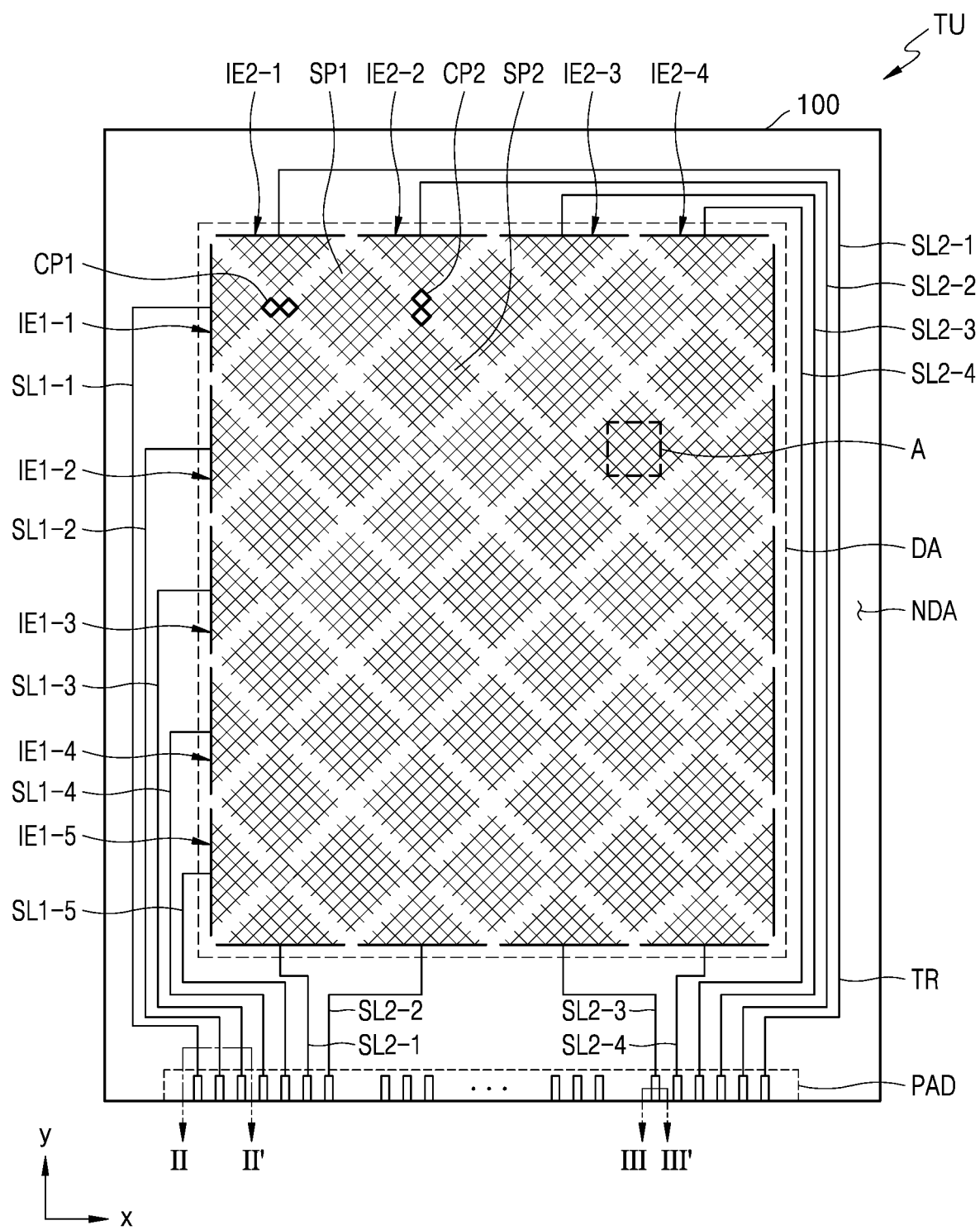
FIG. 4 is a plan view of a touch unit of a display device according to some example embodiments.
Figure 5:
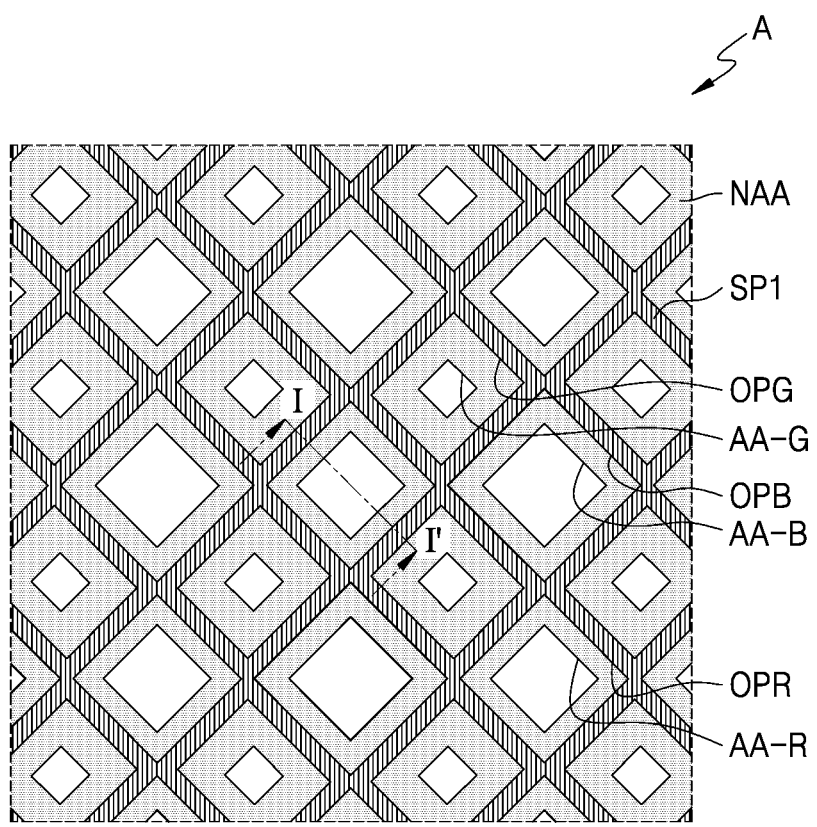
FIG. 5 is an enlarged view of a region A of FIG. 4.

FIG. 4 is a plan view of the touch unit TU of the display device 1 according to some example embodiments, and FIG. 5 is an enlarged view of a region A of FIG. 4.

Referring to FIG. 4, the touch unit TU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

Figure 6:
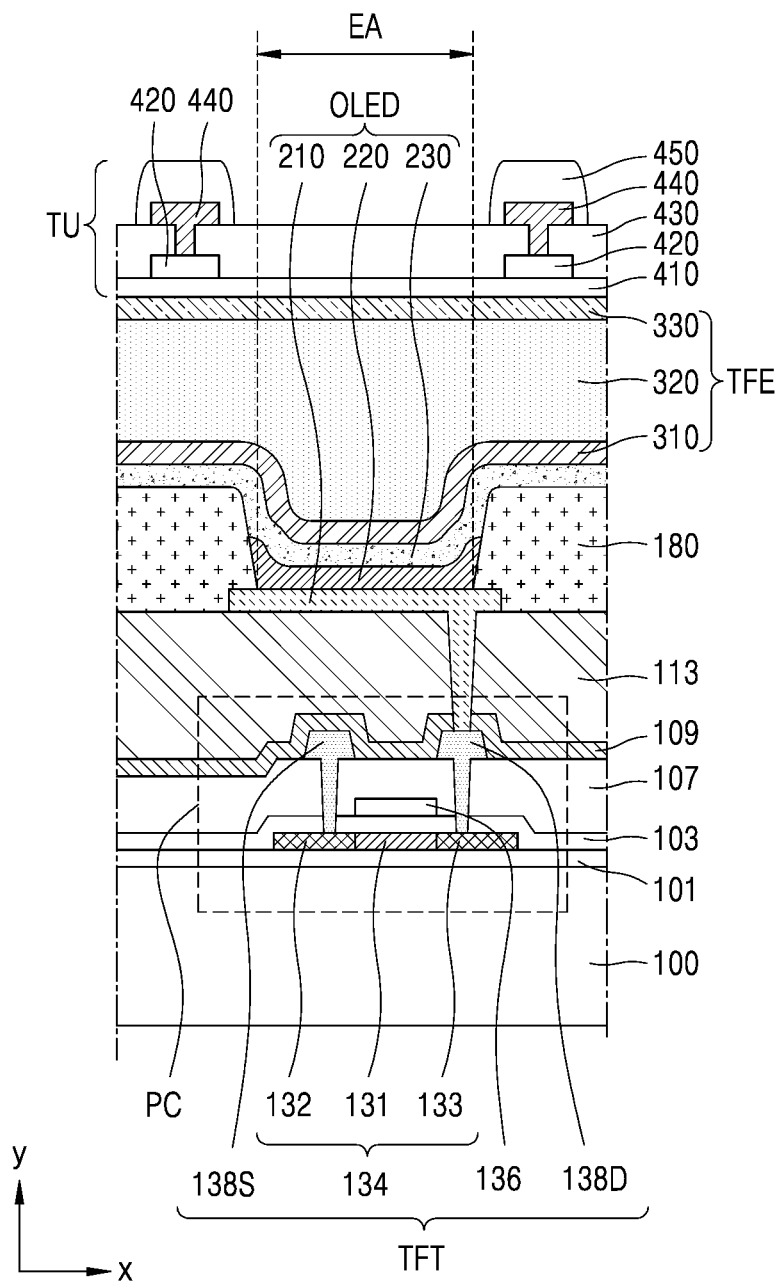
FIG. 6 is a cross-sectional view of a portion of a display area according to some example embodiments.

The touch unit TU according to some example embodiments forms the first sensing electrodes IE1-1 to IE1-5 from a first conductive layer 420 (see FIG. 6) and forms the second sensing electrodes IE2-1 to IE2-4 from a second conductive layer 440 (see FIG. 6). FIG. 6 shows the first sensing electrodes IE1-1 to IE1-5 and the second sensing electrodes IE2-1 to IE2-4 each having a mesh shape as examples. According to some example embodiments, the first sensing electrodes IE1-1 to IE1-5 and the second sensing electrodes IE2-1 to IE2-4 each may have a three-layered structure of Ti/Al/Ti.

According to some example embodiments, the touch unit TU may further include an optical dummy electrode arranged in a boundary region between the first sensing electrodes IE1-1 to IE1-5 and the second sensing electrodes IE2-1 to IE2-4. With regard to this, the touch unit TU may further include first dummy electrodes formed from the first conductive layer 420, and second dummy electrodes formed from the second conductive layer 440.

The first dummy electrodes are connected to second sensors SP2 of the second sensing electrodes IE2-1 to IE2-4 through contact holes. The second dummy electrodes DMP2 may be connected to first sensors SP1 of the first sensing electrodes IE1-1 to IE1-5 through contact holes CNT. The first dummy electrodes DMP1 and the second dummy electrodes DMP2 may reduce resistances of the first sensing electrodes IE1-1 to IE1-5 and the second sensing electrodes IE2-1 to IE2-4.

The first sensing electrodes IE1-1 to IE1-5 each include the first sensors SP1 and first connectors CP1. The second sensing electrodes IE2-1 to IE2-4 each include the second sensors SP2 and second connectors CP2. Two first sensors SP1 arranged at two end portions of a first electrode among the first sensors SP1 may have a smaller size than a size of the first sensor SP1 arranged at a center, for example, ½ the size of the first sensor SP1 arranged at the center. Two second sensors SP2 arranged at two end portions of a second electrode among the second sensors SP2 may have a smaller size than a size of the second sensor SP2 arranged at a center, for example, ½ the size of the second sensor SP2 arranged at the center.

Though it is shown in FIG. 4 that the first sensing electrodes IE1-1 to IE1-5 and the second sensing electrodes IE2-1 to IE2-4 each have a pattern having a specific shape, the shape of the pattern is not limited. According to some example embodiments, though FIG. 4 shows the first sensors SP1 and the second sensors SP2 each having a rhombus shape as examples, the embodiments are not limited thereto and the first sensors SP1 and the second sensors SP2 may have a different polygonal shape. According to some example embodiments, the first sensing electrodes IE1-1 to IE1-5 and the second sensing electrodes IE2-1 to IE2-4 may have a shape (e.g. a bar shape) in which a sensor is not discriminated from a connector.

The first sensors SP1 are listed in an x-direction inside one first sensing electrode, and the second sensors SP2 are listed in a y-direction inside one second sensing electrode. The first connectors CP1 each connect the first sensors SP1 adjacent thereto, and the second connectors CP2 each connect the second sensors SP2 adjacent thereto.

First signal lines SL1-1 to SL1-5 are respectively connected to end portions of the first sensing electrodes IE1-1 to IE1-5. Second signal lines SL2-1 to SL2-4 are connected to end portions of the second sensing electrodes IE2-1 to IE2-4. According to some example embodiments, the first signal lines SL1-1 to SL1-5 may be also connected to two end portions of the first sensing electrodes IE1-1 to IE1-5. the second signal lines SL2-1 to SL2-4 may be respectively connected to only one of the end portions of the second sensing electrodes IE2-1 to IE2-4.

Referring to FIGS. 4 and 5, according to some example embodiments, the first sensing electrodes IE1-1 to IE1-5 and the second sensing electrodes IE2-1 to IE2-4 each may have a mesh shape. Because the first sensing electrodes IE1-1 to IE1-5 and the second sensing electrodes IE2-1 to IE2-4 each have a mesh shape, a parasitic capacitance between the sensing electrodes and electrodes (e.g., an opposite electrode) of the display unit DU may be reduced. Also, as described below, because the first sensing electrodes IE1-1 to IE1-5 and the second sensing electrodes IE2-1 to IE2-4 do not overlap emission areas AA-R, AA-G, and AA-B, the first sensing electrodes IE1-1 to IE1-5 and the second sensing electrodes IE2-1 to IE2-4 are not viewed by a user of the display device 1.

The first sensing electrodes IE1-1 to IE1-5 and the second sensing electrodes IE2-1 to IE2-4 may include Ag, Al, Cu, Cr, Ni, and Ti on which a low-temperature process may be performed, and are not limited thereto. Though an input sensing unit ISU is formed by a successive process, damage to the organic light-emitting diode OLED may be prevented or reduced.

Though FIG. 5 shows the first sensor SP1, the second sensor SP2 has substantially the same structure as that of the first sensor SP1. The first sensor SP1 does not overlap the emission areas AA-R, AA-G, and AA-B and overlaps a non-emission area NAA. The emission areas AA-R, AA-G, and AA-B each may be defined equal to the emission area EA shown in FIG. 6.

The emission areas AA-R, AA-G, and AA-B may be classified into a plurality of groups depending on a color of light generated from an organic light-emitting diode OLED. FIG. 5 shows the emission areas AA-R, AA-G, and AA-B classified into three groups depending on an emission color. According to some example embodiments, the emission areas AA-R, AA-G, and AA-B may respectively emit red light, green light, and blue light.

Though it is shown that mesh holes OPR, OPG, and OPB one-to-one correspond to the emission areas AA-R, AA-G, and AA-B, the embodiments are not limited thereto. Each of the mesh holes OPR, OPG, and OPB may correspond to two or more emission areas AA-R, AA-G, and AA-B. Though it is shown in FIG. 5 that a planar shape of the mesh holes OPR, OPG, and OPB is a rhombus shape corresponding to the shape of the emission areas AA-R, AA-G, and AA-B, the embodiments are not limited thereto. A planar shape of the mesh holes OPR, OPG, and OPB may be a polygonal shape different from a rhombus shape, for example, may be a polygonal shape having round corners.

FIG. 6 is a cross-sectional view of a portion of a display area according to some example embodiments.

Referring to FIG. 6, structures of the display panel DP and the touch unit TU corresponding to the display area DA are shown.

The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including the polymer resin may be flexible, roll-able, or bendable. The substrate 100 may have a multi-layered structure including a layer including a polymer resin and an inorganic layer.

A buffer layer 101 may be located on the substrate 100, may reduce or prevent the penetration of foreign substances, moisture, or external air from below the substrate 100, and may provide a flat surface on the substrate 100. The buffer layer 101 may include an inorganic material such as an oxide or a nitride, or an organic material, or an organic/inorganic composite material and include a single-layered or multi-layered structure of an inorganic material and an organic material. A barrier layer may be further provided between the substrate 100 and the buffer layer 101, the barrier layer blocking the penetration of external air.

A thin film transistor TFT, a storage capacitor Cst, and an organic light-emitting diode OLED, which is a light-emitting element, may be arranged in the display area DA over the substrate 100, the organic light-emitting diode OLED being electrically connected to the thin film transistor TFT and the storage capacitor Cst.

The thin film transistor TFT of FIG. 6 may correspond to one (e.g., the driving thin film transistor Td of the thin film transistors provided to the pixel circuit PC described with reference to FIG. 3.

The thin film transistor TFT includes a semiconductor layer 134 and a gate electrode 136. The semiconductor layer 134 may include, for example, polycrystalline silicon. The semiconductor layer 134 may include a channel region 131, a source region 132, and a drain region 133, the channel region 131 overlapping the gate electrode 136, the source region 132 and the drain region 133 being arranged on two opposite sides of the channel region 131 and including impurities having higher concentration than that of the channel region 131. Here, the impurities may include N-type impurities or P-type impurities. It may be understood that the source region 132 and the drain region 133 are respectively a source electrode and a drain electrode of the thin film transistor TFT.

The semiconductor layer 134 may include an oxide semiconductor and/or a silicon semiconductor. In the case where the semiconductor layer 134 includes an oxide semiconductor, the semiconductor layer 134 may include, for example, an oxide of at least one of In, Ga, Sn, Zr, V, Hf, Cd, Ge, Cr, Ti, or Zn. For example, the semiconductor layer 134 may be ITZO (InSnZnO) or IGZO (InGaZnO). In the case where the semiconductor layer 134 includes a silicon semiconductor, the semiconductor layer 134 may include, for example, amorphous silicon (a-Si) or low-temperature polycrystalline silicon (LTPS) obtained by crystallizing amorphous silicon.

The gate electrode 136 may include a single layer or a multi-layer including at least one metal among Al, Pt, Pd, Ag, Mg, Au, Ni, Nd, Ir, CR, Li, Ca, Mo, Ti, W, and Cu. The gate electrode 136 may be connected to a gate line that applies an electric signal to the gate electrode 136.

A gate insulating layer 103 may be arranged between the semiconductor layer 134 and the gate electrode 136. The gate insulating layer 103 may include at least one inorganic insulating material among $SiO_2$, $SiN_x$, SiON, $Al_2O_3$, $TiO_2$, $Ta_2O_5$, $HfO_2$, and $ZnO_2$. The gate insulating layer 103 may include a single layer or a multi-layer including the above inorganic insulating material.

An interlayer insulating layer 107 may be arranged on the gate electrode 136. The interlayer insulating layer 107 may include $SiO_2$, $SiN_x$, SiON, $Al_2O_3$, $TiO_2$, $Ta_2O_5$, $HfO_2$, or $ZnO_2$ and include a single layer or a multi-layer.

The thin film transistor TFT may include a source electrode 138S and a drain electrode 138D respectively connected to the source region 132 and the drain region 133 of the semiconductor layer 134. The source electrode 138S and the drain electrode 138D are respectively and electrically connected to the source region 132 and the drain region 133 of the semiconductor layer 134 through contact holes passing through the gate insulating layer 103 and the interlayer insulating layer 107.

The source electrode 138S and the drain electrode 138D may include at least one of Al, Cu, or Ti and include a single layer or a multi-layer. According to some example embodiments, the source electrode 138S and the drain electrode 138D may have a multi-layered structure of Ti/Al/Ti or TiN/Al/Ti.

According to some example embodiments, the data line DL (see FIG. 3) and the driving voltage line PL (see FIG. 3) may include the same material as those of the source electrode 138S and the drain electrode 138D and be arranged on the same layer on which the source electrode 138S and the drain electrode 138D are arranged.

The thin film transistor TFT may be covered by a protective layer 109. The protective layer 109 may prevent a wiring, etc., including a metal such as Al from being exposed to an etching environment, the metal being damaged by etchant during a process of manufacturing the display device 1.

A planarization layer 113 may be arranged over the interlayer insulating layer 107. The planarization layer 113 may planarize a surface on which the organic light-emitting diode OLED is to be arranged by planarizing a top surface of the pixel circuit PC.

The planarization layer 113 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The planarization layer 113 may include an inorganic material. The planarization layer 113 may include $SiO_2$, $SiN_x$, SiON, $Al_2O_3$, $TiO_2$, $Ta_2O_5$, $HfO_2$, or $ZnO_2$. In the case where the planarization layer 113 includes an inorganic material, chemical planarization polishing may be performed depending on a case. The planarization layer 113 may include both an organic material and inorganic material.

In the display area DA of the substrate 100, a light-emitting element, that is, the organic light-emitting diode OLED may be arranged on the planarization layer 113, the organic light-emitting diode OLED including a pixel electrode 210, an intermediate layer 220, and an opposite electrode 230 facing the pixel electrode 210 with the intermediate layer 220 therebetween.

The pixel electrode 210 may be arranged on the planarization layer 113. The pixel electrode 210 may include a (semi) transparent electrode or a reflective electrode. According to some example embodiments, the pixel electrode 210 may include a reflective layer and a transparent or semi-transparent electrode layer, the reflective layer including at least one of Ag, Mg, Al, Pt, Pd, Au, Ni, Nd, Ir, Cr, or a compound thereof. The transparent or semi-transparent electrode layer may include at least one of indium tin oxide (ITO), zinc oxide (IZO), zinc oxide (ZnO), indium oxide ($In_2O_3$), indium gallium oxide (IGO), or aluminum zinc oxide (AZO). According to some example embodiments, the pixel electrode 210 may have a stacked structure of ITO/Ag/ITO.

A pixel-defining layer 180 may be arranged on the planarization layer 113. The pixel-defining layer 180 may define an emission area EA of a pixel by including an opening exposing a central portion of the pixel electrode 210. Also, the pixel-defining layer 180 may prevent an arc, etc. from occurring at edges of the pixel electrode 210 by increasing a distance between the edges of the pixel electrode 210 and the opposite electrode 230 over the pixel electrodes 210. The pixel-defining layer 180 may include, for example, an organic insulating material such as polyimide, polyamide, an acrylic resin, BCB, HMDSO, and a phenolic resin. The pixel-defining layer 180 may be formed by a method such as spin coating.

A spacer may be arranged on the pixel-defining layer 180. The spacer may prevent the organic light-emitting diode OLED from being damaged by sagging of a mask during a manufacturing process that uses the mask. The spacer may include, for example, an organic insulating material such as polyimide, polyamide, an acrylic resin, BCB, HMDSO, and a phenolic resin. The spacer may be formed by a method such as spin coating and may include a single layer or a multi-layer.

The intermediate layer 220 may be arranged on the pixel electrode 210 exposed by the pixel-defining layer 180. The intermediate layer 220 may include an emission layer and may selectively further include a functional layer under and on the emission layer, the functional layer including a hole transport layer (HTL), a hole injection layer (HIL), an electron transport layer (ETL), and an electron injection layer (EIL).

The emission layer may include an organic material including a fluorescent or phosphorous material emitting red, green, blue, or white light. The emission layer may include a low molecular weight organic material or a polymer organic material.

In the case where the emission layer includes a low molecular weight material, the intermediate layer 220 have a structure in which an HIL, an HTL, an emission layer (EML), an ETL, an EIL, etc. are stacked in a single or a composite configuration. The intermediate layer 220 may include, as a low molecular weight material, various organic materials such as copper phthalocyanine (CuPc), N, N'-Di (naphthalene-1-yl)-N,N'-diphenyl-benzidine (NPB), and tris-8-hydroxyquinoline aluminum (Alq3). These layers may be formed by vacuum deposition.

In the case where the emission layer includes a polymer material, the intermediate layer 220 may have a structure generally including an HTL and an EML. In this case, the HTL may include PEDOT, and the EML may include a polymer material such as a polyphenylene vinylene (PPV)-based material and a polyfluorene-based material. The emission layer may be formed by screen printing, inkjet printing, laser induced thermal imaging (LITI), etc.

The pixel electrode 210 may be provided as a plurality of pixel electrodes, and the intermediate layer 220 may be arranged to respectively correspond to the plurality of pixel electrodes 210. However, the embodiments are not limited thereto. The intermediate layer 220 may include a layer that is one body over the plurality of pixel electrodes 210. Various modifications may be made. According to some example embodiments, the intermediate layer 220 may be arranged to respectively correspond to the plurality of pixel electrodes 210, and the functional layer(s) except for the intermediate layer 220 may be provided as one body over the plurality of pixel electrodes 210.

The opposite electrode 230 may be arranged on the intermediate layer 220. The opposite electrode 230 may be arranged on the intermediate layer 220 and may entirely cover the intermediate layer 220.

The opposite electrode 230 may be arranged in the display area DA and arranged on an entire surface of the display area DA. That is, the opposite electrode 230 may be provided as one body so as to cover a plurality of pixels.

The opposite electrode 230 may be a transparent electrode or a reflective electrode. According to some example embodiments, the opposite electrode 230 may be a transparent or semi-transparent electrode and may include a metal thin layer having a small work function and including at least one of Li, Ca, LiF/Ca, LiF/Al, Al, Ag, Mg, or a compound thereof. Also, a transparent conductive oxide (TCO) layer may be further arranged on the metal thin layer, the TCO layer including ITO, IZO, ZnO, or $In_2O_3$.

In the case where the pixel electrode 210 includes a reflective electrode, and the opposite electrode 230 includes a transparent electrode, light emitted from the intermediate layer 220 is emitted toward the opposite electrode 230 and thus the display device 1 may become a top-emission type display device.

According to some example embodiments, in the case where the pixel electrode 210 includes a transparent or semi-transparent electrode and the opposite electrode 230 includes a reflective electrode, light emitted from the intermediate layer 220 is emitted toward the substrate 100 and thus the display device 1 may become a bottom-emission type display device. However, embodiments according to the present disclosure are not limited thereto and the display device 1 according to some example embodiments may be a dual-emission type display device that emits light in two directions including a top side and a bottom side.

The thin-film encapsulation layer TFE may be arranged on the opposite electrode 230 to protect the organic light-emitting diode OLED from external moisture and oxygen. The thin-film encapsulation layer TFE may include at least one organic encapsulation layer and at least one inorganic encapsulation layer.

The thin-film encapsulation layer TFE may include a first inorganic encapsulation layer 310, a second inorganic encapsulation layer 330, and an organic encapsulation layer 320, the second inorganic encapsulation layer 330 being over the first inorganic encapsulation layer 310, and the organic encapsulation layer 320 being between the first inorganic encapsulation layer 310 and the second inorganic encapsulation layer 330.

The first inorganic encapsulation layer 310 and the second inorganic encapsulation layer 330 each may include at least one inorganic material among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or a multi-layer including the above materials. The first inorganic encapsulation layer 310 and the second inorganic encapsulation layer 330 may include the same material or different materials.

The organic encapsulation layer 320 may include a monomer-based material or a polymer-based material. The organic encapsulation layer 320 may include polyethylene terephthalate (PET), polyethylene naphthalate (PEN), polycarbonate (PC), polyimide (PI), polyethylene sulfonate, polyoxymethylene, polyarylate, hexamethyldisiloxane (HMDSO), an acrylic-based resin (e.g. polymethyl methacrylate (PMMA), polyacrylic acid, etc.), or an arbitrary combination thereof.

The touch unit TU may be arranged on the thin-film encapsulation layer TFE. The touch unit TU may be directly arranged on the thin-film encapsulation layer TFE. The touch unit TU is described below in detail with reference to FIG. 7.

Figure 7:
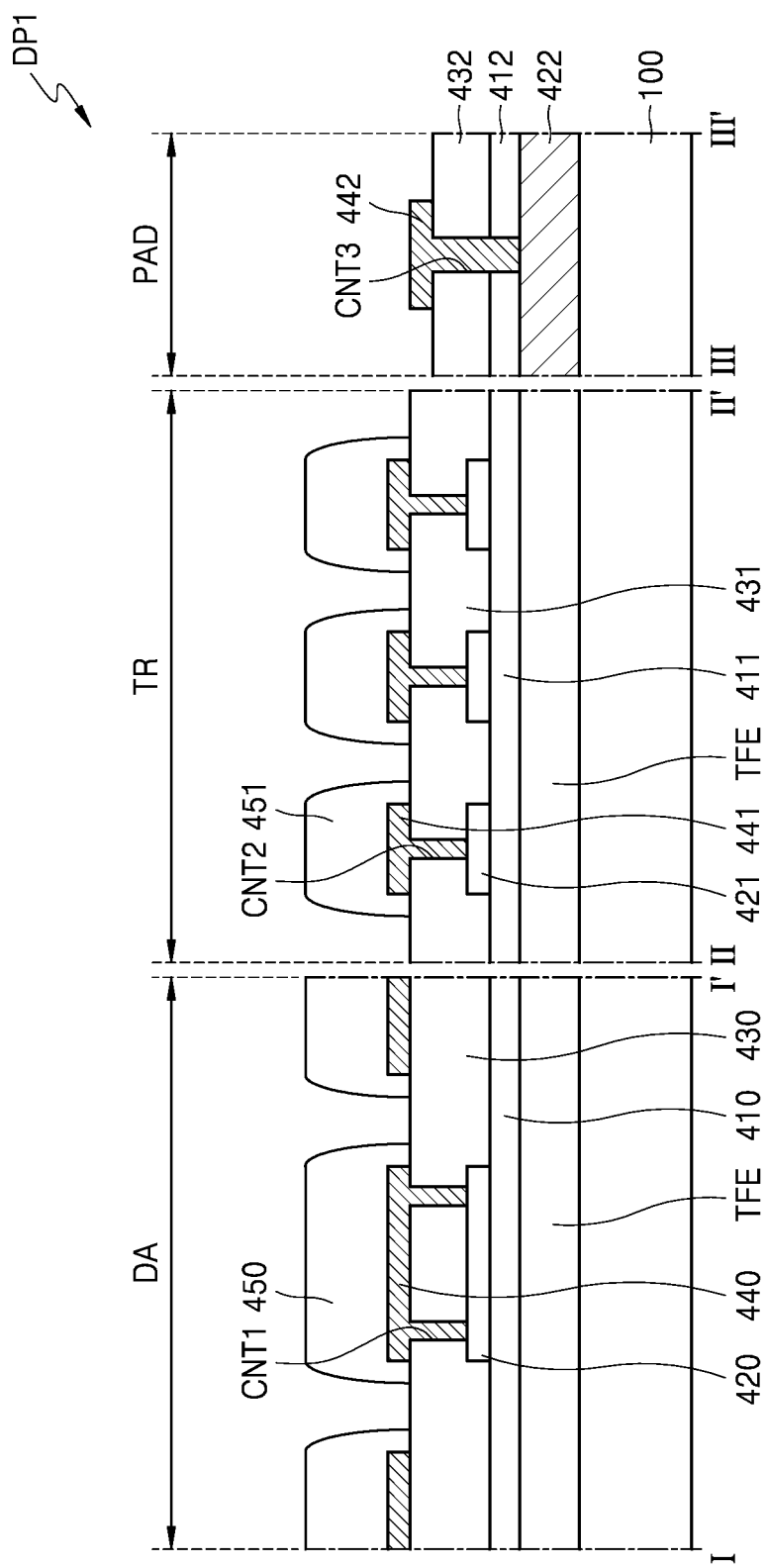
FIGS. 7 and 8 are cross-sectional views of a portion of a region of a display device according to some example embodiments.
Figure 8:
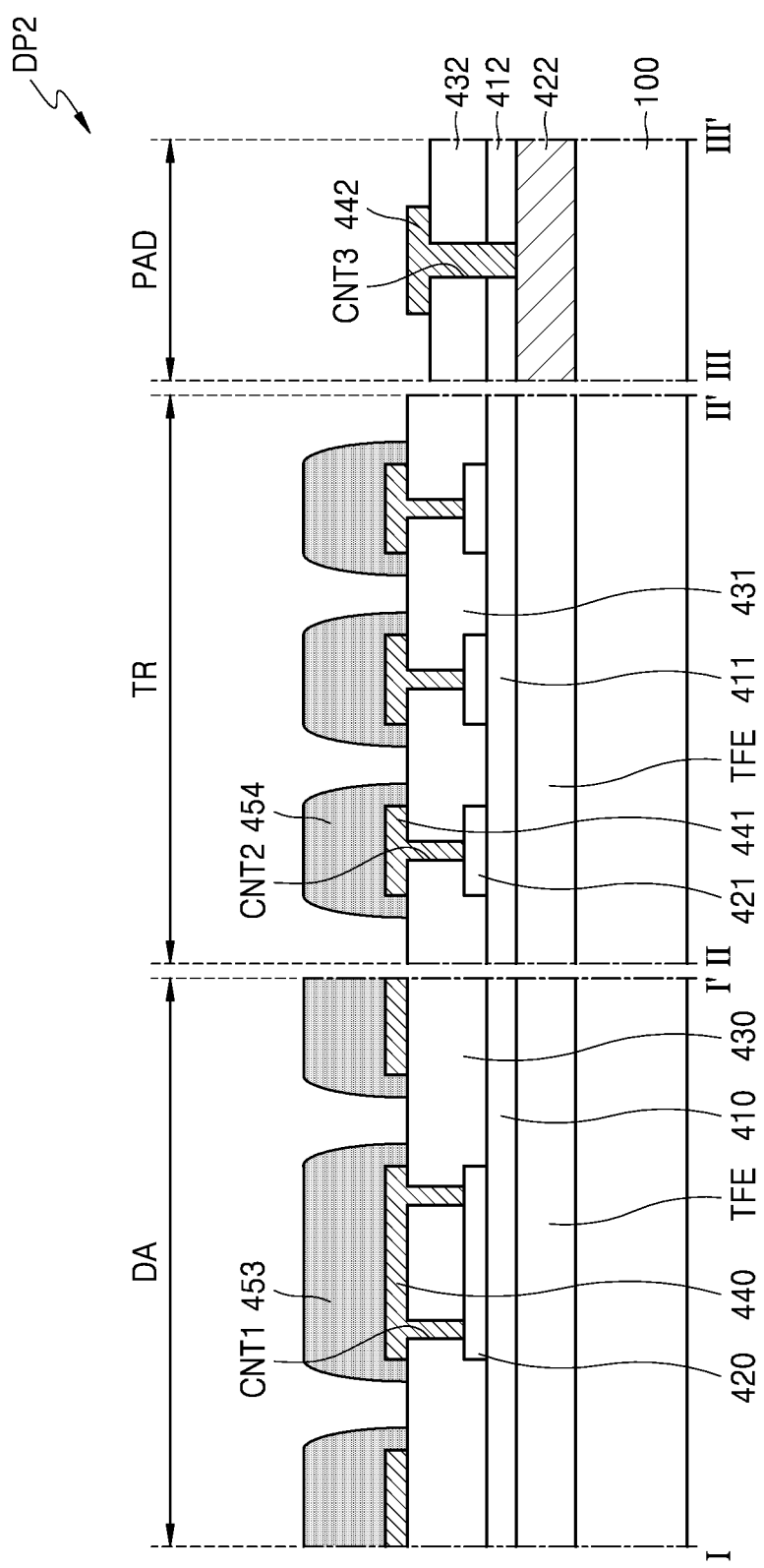

FIGS. 7 and 8 are cross-sectional views of a portion of a region of the display device 1 according to some example embodiments.

Though it is shown in FIGS. 7 and 8 that the thin-film encapsulation layer TFE and a bottom conductive layer 422 are arranged on the substrate 100, the thin film transistor TFT, the storage capacitor Cst, and the organic light-emitting diode OLED provided in the display area DA may be arranged over the substrate 100 as shown in FIG. 6, the organic light-emitting diode OLED being electrically connected to the thin film transistor TFT and the storage capacitor Cst. FIGS. 7 and 8 briefly show the elements, for convenience of description.

Referring to FIG. 7, a display panel DP1 of the display device 1 according to some example embodiments includes the substrate 100 and the touch unit TU, the substrate 100 including the display area DA and the non-display area NDA, and the touch unit TU being arranged on the substrate 100.

A first inorganic insulating layer 410, a first conductive layer 420, and a first organic layer 430, a second conductive layer 440, and a second organic layer 450 may be arranged on the thin-film encapsulation layer TFE in the display area DA.

The first inorganic insulating layer 410 may have a single-layered or multi-layered structure. According to some example embodiments, the first inorganic insulating layer 410 may include at least one inorganic insulating material among $SiO_2$, $SiN_x$, SiON, $Al_2O_3$, $TiO_2$, $Ta_2O_5$, $HfO_2$, and $ZnO_2$. The first inorganic insulating layer 410 is substantially the same layer as a first layer 411 and a first layer 412, which are described below, and may include the same material as those of the first layer 411 and the first layer 412.

The first inorganic insulating layer 410 may be arranged on the thin-film encapsulation layer TFE to prevent the thin-film encapsulation layer TFE from being damaged during a process of arranging the touch unit TU.

The first conductive layer 420 may be arranged on the first inorganic insulating layer 410, and the second conductive layer 440 may be arranged over the first conductive layer 420. The first conductive layer 420 and the second conductive layer 440 may include one of the first sensing electrodes IE1-1 to IE1-5 and the second sensing electrodes IE2-1 to IE2-4.

The first conductive layer 420 and the second conductive layer 440 may have a single-layered structure or a stacked multi-layered structure. The first conductive layer 420 and the second conductive layer 440 having a single-layered structure may include a metal layer or a transparent conductive layer. The metal layer may include at least one of Mo, Ag, Ti, Cu, Al, or an alloy thereof. The transparent conductive layer may include a transparent conductive oxide such as ITO, IZO, ZnO, and ITZO.

In addition, the transparent conductive layer may include a conductive polymer such as PEDOT, a metal nano wire, and graphene. The first conductive layer 420 and the second conductive layer 440 having a multi-layered structure may include a multi-metal layer. The first conductive layer 420 and the second conductive layer 440 may include, for example, a three-layered structure of Ti/Al/Ti. The first conductive layer 420 and the second conductive layer 440 having a multi-layered structure may include at least one metal layer and at least one transparent conductive layer. The first conductive layer 420 may include the same material as that of a first wiring layer 421 described below, and the second conductive layer 440 may include the same material as those of a second wiring layer 441 and a top conductive layer 442 described below.

As shown in FIG. 7, because the first conductive layer 420 and the second conductive layer 440 do not overlap emission areas, the first conductive layer 420 and the second conductive layer 440 may not be viewed by a user of the display device 1. The first conductive layer 420 may be electrically connected to the second conductive layer 440 through a first contact hole CNT1 defined in the first organic layer 430 described below.

In a related art display device, the touch unit TU may be configured by arranging an inorganic layer between the first conductive layer 420 and the second conductive layer 440. In the case where the inorganic layer is arranged between the first conductive layer 420 and the second conductive layer 440, because a limit curvature radius of the panel is small and a thickness of the inorganic layer is small, a touch performance is deteriorated.

To avoid such deterioration, a method of configuring the touch unit TU may include arranging the first organic layer 430 between the first conductive layer 420 and the second conductive layer 440. However, for reliability of the emission layer, a process of less than 100° C. may be utilized during a process of arranging the touch unit TU on the thin-film encapsulation layer TFE. For this reason, the temperature of a process of hardening the organic layer is limited. The first organic layer 430 having an insufficient hardness against low-temperature hardening may be vulnerable to chemical resistance against a stripper while a photosensitive material is stripped after a photo process of arranging the second conductive layer 440 on the first organic layer 430 by using the photosensitive material. Therefore, an exposed portion of the first organic layer 430 may be lifted by the stripper and thus the first organic layer 430 may be damaged.

In contrast, in the display device 1 according to some example embodiments, because the second conductive layer 440 is patterned by using the second organic layer 450 arranged on the second conductive layer 440 and including a photosensitive material as a photoresist, a process of separately stripping the photosensitive material is not required. Therefore, the damage to the first organic layer 430 arranged between the first conductive layer 420 and the second conductive layer 440 may be prevented or reduced. That is, according to some example embodiments, by avoiding a processing operation of stripping photosensitive material, damage to underlying layers may be avoided or reduced.

Also, a process of arranging the second organic layer 450 on the second conductive layer 440 is not separately performed after a process of arranging the second conductive layer 440 on the first organic layer 430. Instead, because the second conductive layer 440 and the second organic layer 450 are simultaneously arranged during one process, the manufacturing process may be relatively simplified and a smaller number of masks may be used compared to a related art manufacturing process, and thus a manufacturing efficiency may be improved.

The first organic layer 430 may be arranged on the first conductive layer 420. The first organic layer 430 may include at least one of an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

Because an organic layer (that is, the first organic layer 430) instead of an inorganic layer is arranged on the first conductive layer 420, a limit curvature radius of the panel increases and a folding characteristic may be improved. Also, because a thickness between the first conductive layer 420 and the second conductive layer 440 increases and a parasitic capacitance is reduced, a touch sensitivity of the touch unit TU may be improved and a touch performance may be improved.

The first contact hole CNT1 may be defined in the first organic layer 430, and the first conductive layer 420 may be electrically connected to the second conductive layer 440 through the first contact hole CNT1. The first organic layer 430 may include the same material as those of a second layer 431 and a second layer 432 described below.

The second conductive layer 440 and the second organic layer 450 may be arranged on the first organic layer 430. The second organic layer 450 may include at least one of an acrylic-based resin, a methacrylate-based resin, polyisoprene, vinyl-based resin, an epoxy-based resin, a urethane-based resin, a cellulose-based resin, a siloxane-based resin, a polyimide-based resin, a polyimide-based resin, or a perylene-based resin. For example, the second organic layer 450 may include a photosensitive material.

To improve a transmittance of the display device 1, the first organic layer 430 and the second organic layer 450 may include different materials, and a refractive index of the first organic layer 430 may be different from a refractive index of the second organic layer 450.

As shown in FIG. 7, the second organic layer 450 may be arranged on the second conductive layer 440. During a process of arranging the second conductive layer 440 on the first organic layer 430, the second conductive layer 440 may be patterned by using the second organic layer 450 including a photosensitive material as a photoresist.

After the second conductive layer 440 is patterned, a portion of the second organic layer 450 may reflow through a curing process, thereby covering a lateral surface of the second conductive layer 440. Through this, the second organic layer 450 may be arranged on the second conductive layer 440 so as to cover lateral surfaces and a top surface of the second conductive layer 440.

Referring to FIG. 8, a second organic layer 453 of a display panel DP2 according to some example embodiments may include a light-blocking material, and the light-blocking material may be a black matrix. The black matrix may include various materials, for example, an organic material mixed with a black pigment, Cr or $CrO_x$. In the case where the black matrix includes Cr or $CrO_x$, the black matrix may include a single layer or a multi-layer including Cr or $CrO_x$.

In the case where the display device 1 includes a black matrix, external light reflection may be sufficiently prevented or reduced.

The non-display area NDA of the display device 1 according to some example embodiments may include a wiring area TR and a pad area PAD located on one side of the display area DA. The touch unit TU in the wiring area TR may include the first layer 411, the first wiring layer 421, the second layer 431, the second wiring layer 441, and a third layer 451.

The first layer 411 may be arranged on the thin-film encapsulation layer TFE. Because the first layer 411 is arranged on the thin-film encapsulation layer TFE, the first layer 411 may prevent the thin-film encapsulation layer TFE from being damaged during a process of forming the touch unit TU.

The first layer 411 may include the same material as those of the first inorganic insulating layer 410 and the first layer 412 described below.

The first wiring layer 421 may be arranged on the first layer 411, and the second wiring layer 441 may be arranged on the first wiring layer 421. The first wiring layer 421 and the second wiring layer 441 may include one of the first signal lines SL1-1 to SL1-5 and the second signal lines SL2-1 to SL2-4.

As shown in FIG. 7, the first wiring layer 421 and the second wiring layer 441 may be more densely arranged than the first conductive layer 420 and the second conductive layer 440 arranged in the display area DA.

The first wiring layer 421 may include the same material as that of the first conductive layer 420, and the second wiring layer 441 may include the same material as those of the second conductive layer 440 and the top conductive layer 442 described below.

The second layer 431 may be arranged between the first wiring layer 421 and the second wiring layer 441. The second layer 431 may include the same material as those of the first organic layer 430 and the second layer 432 described below.

Because an organic layer (that is, for example, the second layer 431) instead of an inorganic layer is arranged on the first wiring layer 421, a limit curvature radius of the panel increases and a folding characteristic may be improved.

A second contact hole CNT2 may be defined in the second layer 431. The first wiring layer 421 may be electrically connected to the second wiring layer 441 through the second contact hole CNT2. The second layer 431 may include the same material as that of the first organic layer 430.

The second wiring layer 441 and a third layer 451 may be arranged on the second layer 431. The third layer 451 may include at least one of an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyimide-based resin, or a perylene-based resin. For example, the third layer 451 may include a photosensitive material.

As shown in FIG. 7, the third layer 451 may be arranged on the second wiring layer 441. During a process of arranging the second wiring layer 441 on the second layer 431, the second wiring layer 441 may be patterned by using the third layer 451 including a photosensitive material as a photoresist.

After the second wiring layer 441 is patterned, a portion of the third layer 451 may reflow through a curing process, thereby covering a lateral surface of the second wiring layer 441. Through this, the third layer 451 may be arranged on the second wiring layer 441 so as to cover lateral surfaces and a top surface of the second wiring layer 441. The third layer 451 may include the same material as that of the second organic layer 450.

Referring to FIG. 8, a third insulating layer 454 of the display panel DP2 according to some example embodiments may include a light-blocking material, and the light-blocking material may be a black matrix. The black matrix may include various materials, for example, an organic material mixed with a black pigment, Cr or $CrO_x$. In the case where the black matrix includes Cr or $CrO_x$, the black matrix may include a single layer or a multi-layer including Cr or $CrO_x$. In the case where the display device 1 includes a black matrix, external light reflection may be sufficiently prevented.

The bottom conductive layer 422 may be arranged in the pad area PAD of the non-display area NDA. While the source electrode 138S and the drain electrode 138D in the display area DA are formed, the bottom conductive layer 422 may be simultaneously formed with the drain electrode 138D in the display area DA and may include the same material as those of the source electrode 138S and the drain electrode 138D in the display area DA.

The first layer 412 may be arranged on the bottom conductive layer 422. The first layer 412 may include the same material as those of the first inorganic insulating layer 410 and the first layer 411.

The second layer 432 may be arranged on the first layer 412. The second layer 432 may include the same material as those of the first organic layer 430 and the second layer 431.

A third contact hole CNT3 may be defined in the first layer 412 and the second layer 432. The bottom conductive layer 422 may be electrically connected to the top conductive layer 442 described below through the third contact hole CNT3.

The top conductive layer 442 may be arranged on the second layer 432. The top conductive layer 442 may configure one of the first signal lines SL1-1 to SL1-5, the second signal lines SL2-1 to SL2-4, and a pad unit SL-P.

A top surface of the top conductive layer 442 is not covered by an insulating layer and may be exposed to the outside. The top conductive layer 442 may include the same material as those of the second conductive layer 440 and the second wiring layer 441.

Figure 9:
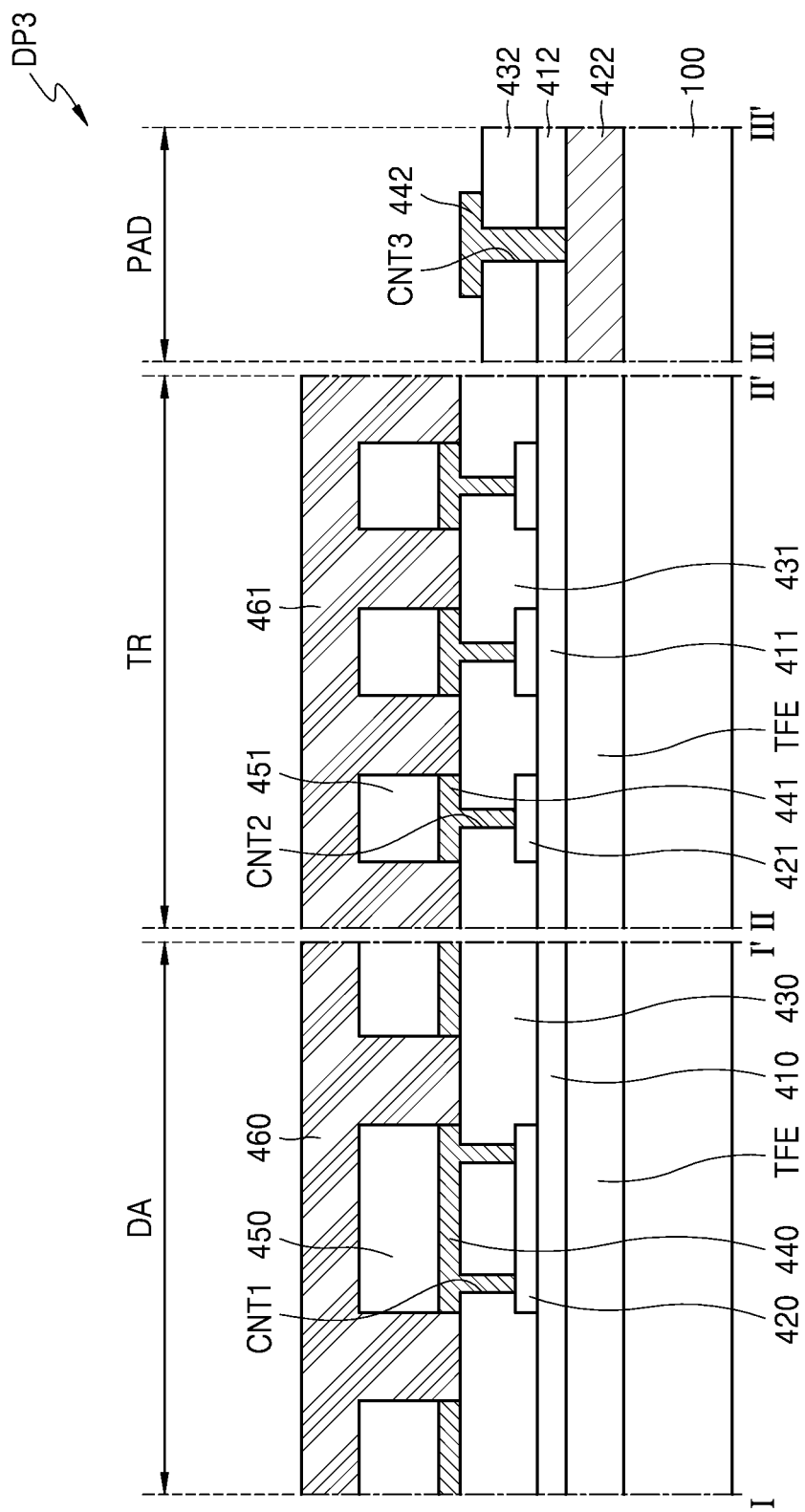
FIGS. 9 and 10 are cross-sectional views of a portion of a region of a display device according to some example embodiments.
Figure 10:
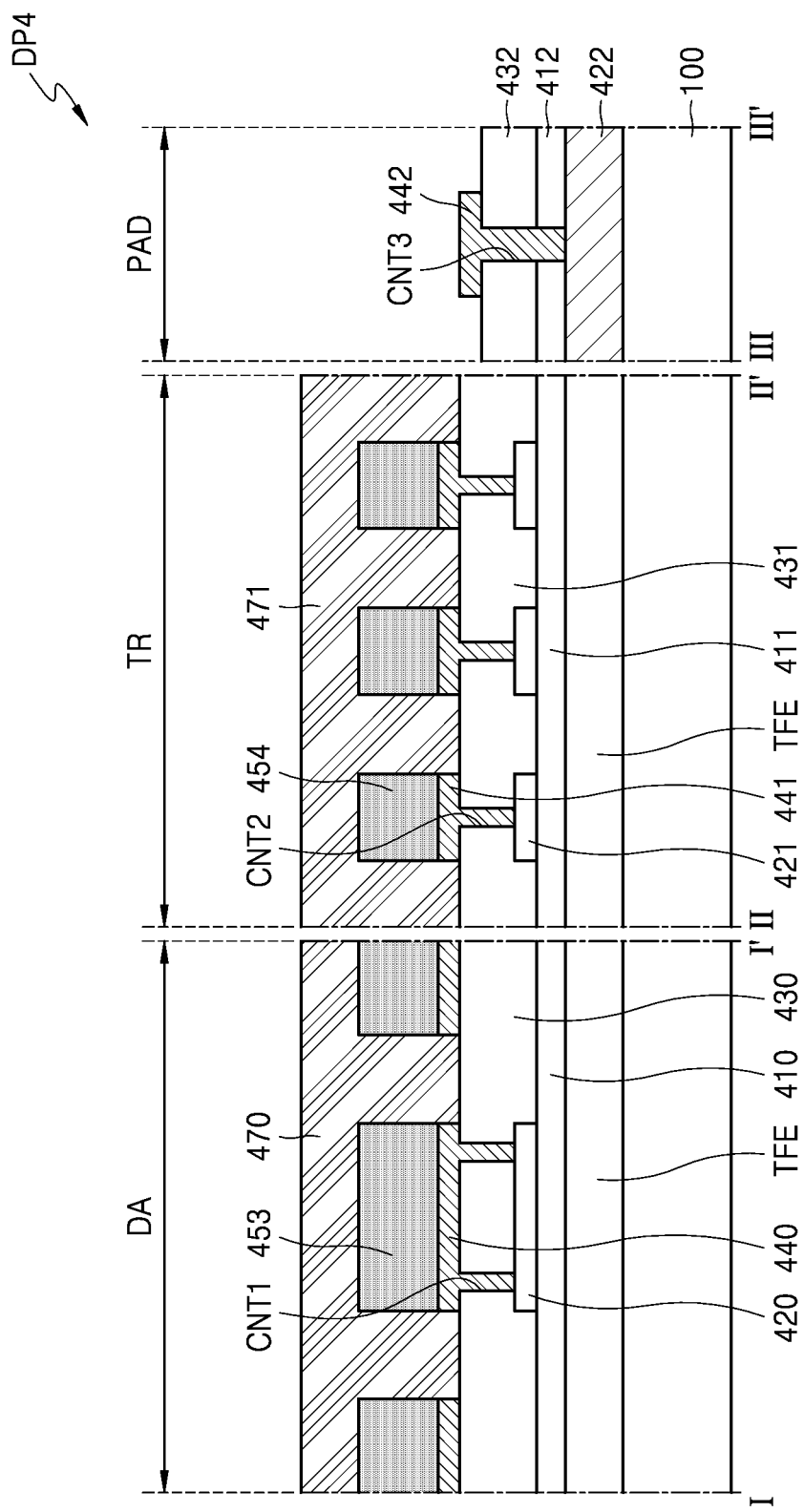

FIGS. 9 and 10 are cross-sectional views of a portion of a region of the display device 1 according to some example embodiments.

Hereinafter, display panels DP3 and DP4 according to some example embodiments are described with reference to FIGS. 9 and 10. Same elements as those described in FIG. 7 are not repeatedly described.

Referring to FIG. 9, the display panel DP3 of the display device according to some example embodiments may include the substrate 100 including the display area DA and the non-display area NDA, and the touch unit TU arranged on the substrate 100. The touch unit TU may include the first inorganic insulating layer 410 arranged in the display area DA, the first conductive layer 420 arranged on the first inorganic insulating layer 410, the first organic layer 430 arranged on the first conductive layer 420, the second conductive layer 440 arranged on the first organic layer 430 and electrically connected to the first conductive layer 420 through the first contact hole CNT1 defined in the first organic layer 430, the second organic layer 450 arranged on the second conductive layer 440 so as to cover a top surface of the second conductive layer 440, including a lateral surface located on the same plane as a lateral surface of the second conductive layer 440, and including a photosensitive material, and a third organic layer 460 arranged on the second organic layer 450.

The non-display area NDA may include the wiring area TR and the pad area PAD located on one side of the display area DA, and may further include the first layer 411 arranged in the wiring area TR, the first wiring layer 421 arranged on the first layer 411, the second layer 431 arranged on the first wiring layer 421, the second wiring layer 441 arranged on the second layer 431 so as to be electrically connected to the first wiring layer 421 through the second contact hole CNT2 defined in the second layer 431, the second wiring layer 441 including the same material as that of the second conductive layer 440, the third layer 451 arranged on the second wiring layer 441 so as to cover a top surface of the second wiring layer 441, having a lateral surface located on the same plane as a lateral surface of the second wiring layer 441, and including a photosensitive material, and a fourth insulating layer 461 arranged on the third layer 451.

The second organic layer 450 may be arranged on the second conductive layer 440. The second organic layer 450 may be located on the second conductive layer 440 so as to cover the second conductive layer 440, and a lateral surface of the second organic layer 450 may be located on the same plane as a lateral surface of the second conductive layer 440. The third layer 451 may be arranged on the second wiring layer 441. The third layer 451 may be arranged on the second wiring layer 441 so as to cover a top surface of the second wiring layer 441, and a lateral surface of the third layer 451 may be located on the same plane as a lateral surface of the second wiring layer 441. For example, the second organic layer 450 and the third layer 451 may include a photosensitive material.

The third organic layer 460 may be arranged on the first organic layer 430 and the second organic layer 450 so as to entirely cover the first organic layer 430 and the second organic layer 450, thereby improving a passivation effect by the organic layer. Also, the fourth insulating layer 461 may be arranged on the second layer 431 and the third layer 451 so as to entirely cover the second layer 431 and the third layer 451, thereby improving a passivation effect by the organic layer.

To improve a transmittance of the display device 1, the first organic layer 430, the second organic layer 450, and the third organic layer 460 include different materials, and a refractive index of the first organic layer 430, a refractive index of the second organic layer 450, and a refractive index of the third organic layer 460 may be different from one another.

Referring to FIG. 10, the second organic layer 453 and the third layer 454 of the display panel DP4 according to some example embodiments may include a light-blocking material, and the light-blocking material may be a black matrix. The black matrix may include various materials, for example, an organic material mixed with a black pigment, Cr or $CrO_x$. In the case where the black matrix includes Cr or $CrO_x$, the black matrix may include a single layer or a multi-layer including Cr or $CrO_x$. In the case where the display device 1 includes a black matrix, external light reflection may be sufficiently prevented.

The second organic layer 453 and the third layer 454 may include a light-blocking material. A third organic layer 470 and a fourth insulating layer 471 may be respectively arranged on the second organic layer 453 and the third layer 454 including the light-blocking material. Because the second organic layer 453 and the third layer 454 include a black matrix, reflectivity may be improved. Because the third organic layer 470 and the fourth insulating layer 471 are respectively arranged on the second organic layer 453 and the third layer 454, a passivation effect may be improved.

FIGS. 11A to 11E are cross-sectional views of some of a method of manufacturing the display device 1 according to some example embodiments.

Though it is shown in FIGS. 11A to 11E that the thin-film encapsulation layer TFE and the bottom conductive layer 422 are arranged on the substrate 100, the thin film transistor TFT, the storage capacitor Cst, and the organic light-emitting diode OLED may be arranged in the display area DA of the substrate 100 as shown in FIG. 6, the organic light-emitting diode OLED being electrically connected to the thin film transistor TFT and the storage capacitor Cst. FIGS. 11A to 11E briefly show the elements, for convenience of description.

Hereinafter, a method of manufacturing the display device 1 is sequentially described with reference to FIGS. 11A to 11E.

The method of manufacturing the display device 1 includes: preparing the substrate 100 including the display area DA, the wiring area TR, and the pad area PAD, the wiring area TR and the pad area PAD being located on one side of the display area DA; forming the bottom conductive layer 422 in the pad area PAD; forming the first inorganic insulating layer 410 in the display area DA, forming the first layer 411 in the wiring area TR, and forming the first layer 412 on the bottom conductive layer 422; forming the first conductive layer 420 on the first inorganic insulating layer 410 and forming the first wiring layer 421 on the first layer 411; forming the first organic layer 430 on the first conductive layer 420, forming the second layer 431 on the first wiring layer 421, and forming the second layer 432 on the first layer 412; forming the first conductive material layer on the first organic layer 430, forming a second conductive material layer on the second layer 431, and forming a third conductive material layer on the second layer 432; patterning the second organic layer 450 including a photosensitive material on the first conductive material layer, patterning the third layer 451 including a photosensitive material on the second conductive material layer, and patterning the third layer 452 including a photosensitive material on the third conductive material layer; patterning the first conductive material layer, patterning the second conductive material layer, and patterning the third conductive material layer to respectively form the second conductive layer 440, the second wiring layer 441, and the top conductive layer 442 by respectively using the second organic layer 450, the third layer 451, and the third layer 452 as photoresists; and removing the third layer 452.

During the preparing of the substrate 100, a substrate composition material is coated on a carrier substrate, and then the substrate 100 may be formed by hardening the substrate composition material. For example, a polyimide (PI) substrate may be formed by hardening a polyamic acid composition solution.

After the preparing of the substrate 100, the forming of the bottom conductive layer 422 in the pad area PAD may be performed.

Figure 11A:
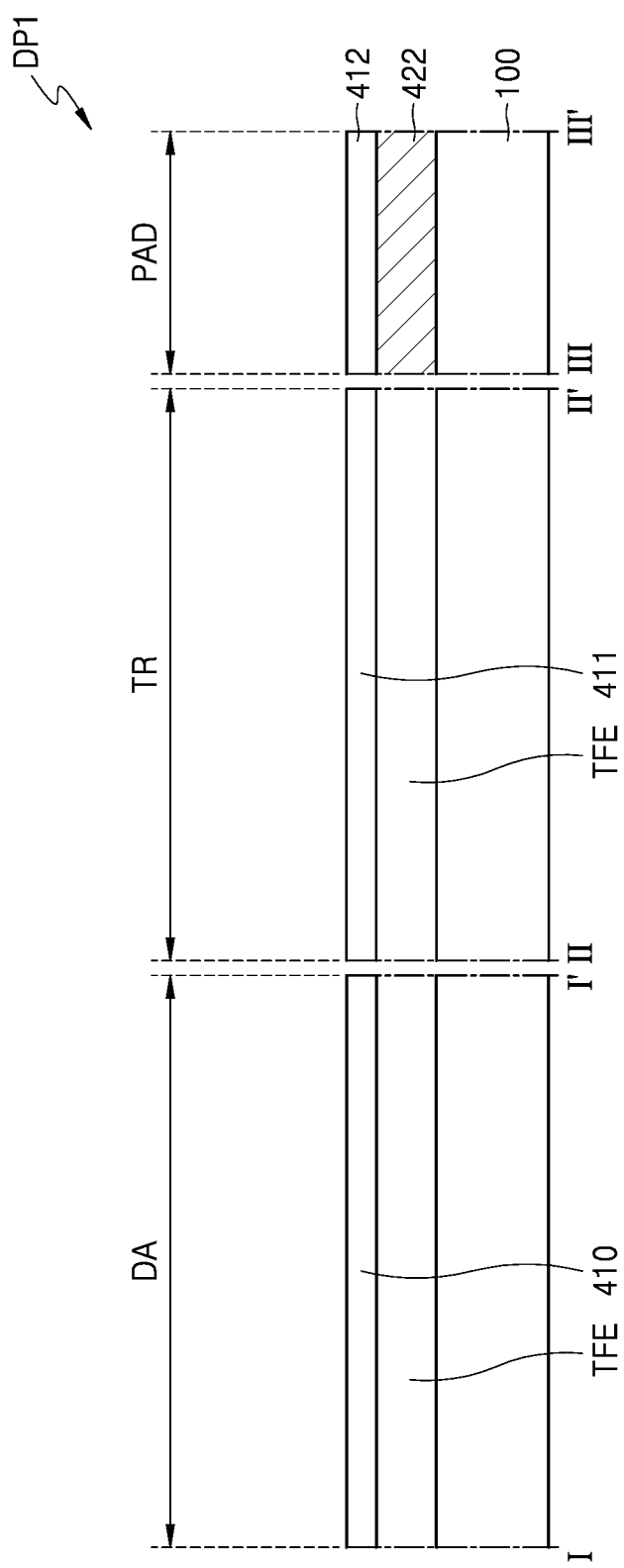

Then, as shown in FIG. 11A, after the forming of the bottom conductive layer 422, the forming of the first inorganic insulating layer 410 in the display area DA, the forming of the first layer 411 in the wiring area TR, and the forming of the first layer 412 on the bottom conductive layer 422 may be performed.

Figure 11B:
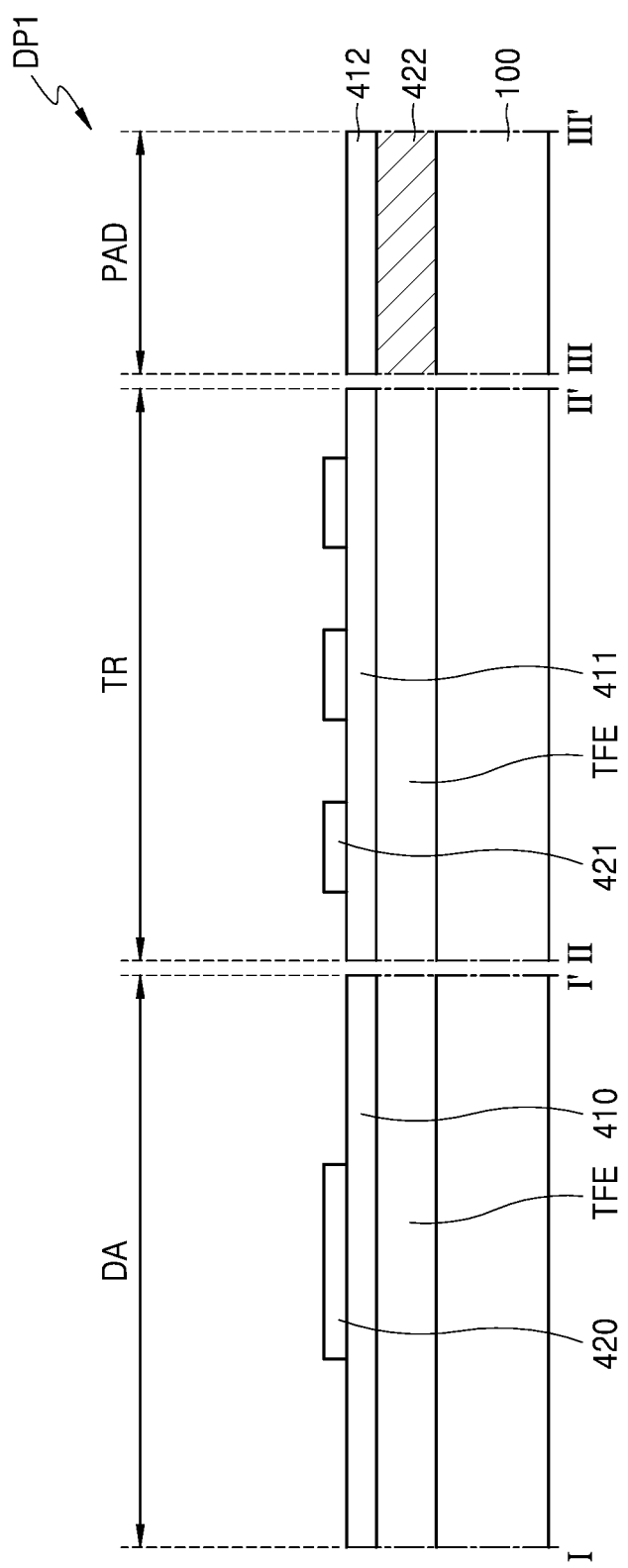

Then, as shown in FIG. 11B, the forming of the first conductive layer 420 on the first inorganic insulating layer 410, and the forming of the first wiring layer 421 on the first layer 411 may be performed. The first conductive layer 420 may be patterned on the first inorganic insulating layer 410 so as not to overlap the emission area. The first conductive layer 420 may include one of the first sensing electrodes IE1-1 to IE1-5 and the second sensing electrodes IE2-1 to IE2-4.

Then, as shown in FIG. 11C, the forming of the first organic layer 430 on the first conductive layer 420, the forming of the second layer 431 on the first wiring layer 421, and the forming of the second layer 432 on the first layer 412 may be performed. The display device 1 according to some example embodiments may improve folding and touch performance by arranging the first conductive layer 420, the second conductive layer 440, and the first organic layer 430.

Figure 11D:
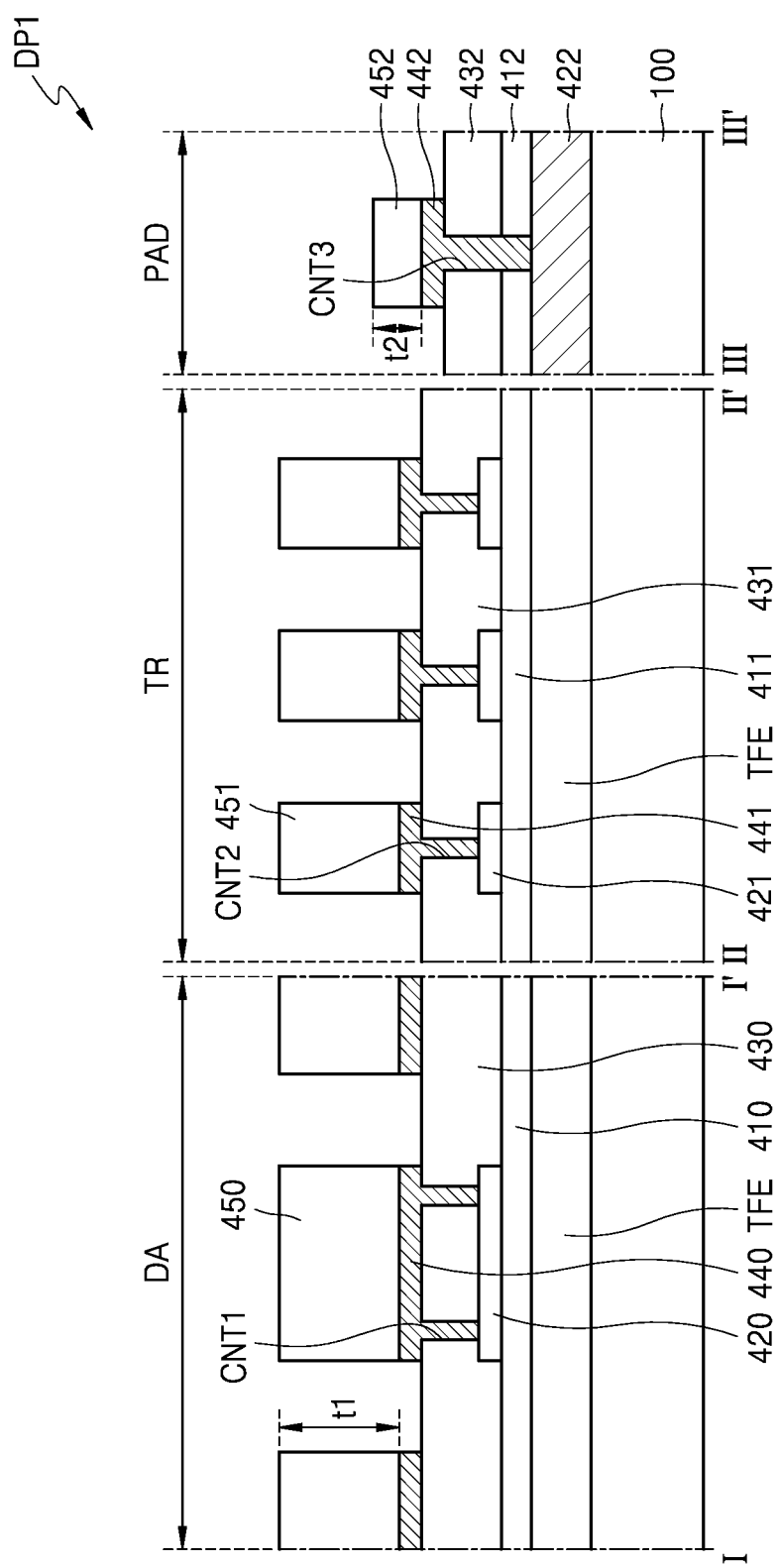

Then, as shown in FIG. 11D, the forming of the first conductive material layer on the first organic layer 430, the forming of the second conductive material layer on the second layer 431, and the forming of the third conductive material layer on the second layer 432; the patterning of the second organic layer 450 including a photosensitive material on the first conductive material layer, the patterning of the third layer 451 including a photosensitive material on the second conductive material layer, and the patterning of the third layer 452 including a photosensitive material on the third conductive material layer; and the patterning of the first conductive material layer, the second conductive material layer, and the third conductive material layer to respectively form the second conductive layer 440, the second wiring layer 441, and the top conductive layer 442 by respectively using the second organic layer 450, the third layer 451, and the third layer 452 as photoresists may be sequentially performed.

In the method of manufacturing the display device 1 according to some example embodiments, because the second conductive layer 440, the second wiring layer 441, and the top conductive layer 442 are formed by respectively patterning the first conductive material layer, the second conductive material layer, and the third conductive material layer respectively using the second organic layer 450, the third layer 451, and the third layer 452 each including a photosensitive material as photoresists, a separate process of stripping a photosensitive material is not required. Therefore, the damage to the first organic layer 430, the second layer 431, and the second layer 432 may be prevented, the first organic layer 430 being arranged between the first conductive layer 420 and the second conductive layer 440, the second layer 431 being arranged between the first wiring layer 421 and the second wiring layer 441, and the second layer 432 being arranged between the bottom conductive layer 422 and the top conductive layer 442.

Also, a process of patterning the second organic layer 450 on the second conductive layer 440 may not be performed after a process of patterning the second conductive layer 440 on the first organic layer 430. Instead, the second conductive layer 440 and the second organic layer 450 may be simultaneously patterned during one process (or one processing operation or stage). Therefore, the manufacturing process may be relatively simplified, and a fewer number of masks may be used compared to a related art manufacturing process and thus a manufacturing efficiency may be improved.

According to some example embodiments, an insulating layer is not formed on the top conductive layer 442, and an insulating layer may also be formed on the top conductive layer 442 so as to simultaneously form the second conductive layer 440 and the second organic layer 450.

In the operation of forming the second conductive layer 440 and the second organic layer 450 on the first organic layer 430, forming the second wiring layer 441 and the third layer 451 on the second layer 431, and forming the top conductive layer 442 and the third layer 452 on the second layer 432, the third layer 452 having a thin thickness may be formed on the top conductive layer 442 by using a half-tone mask. For example, the second organic layer 450 may have a first thickness t1 from a top surface of the second conductive layer 440, and the third layer 452 may have a second thickness t2 from a top surface of the top conductive layer 442, the second thickness t2 being less than the first thickness t1.

Figure 11E:
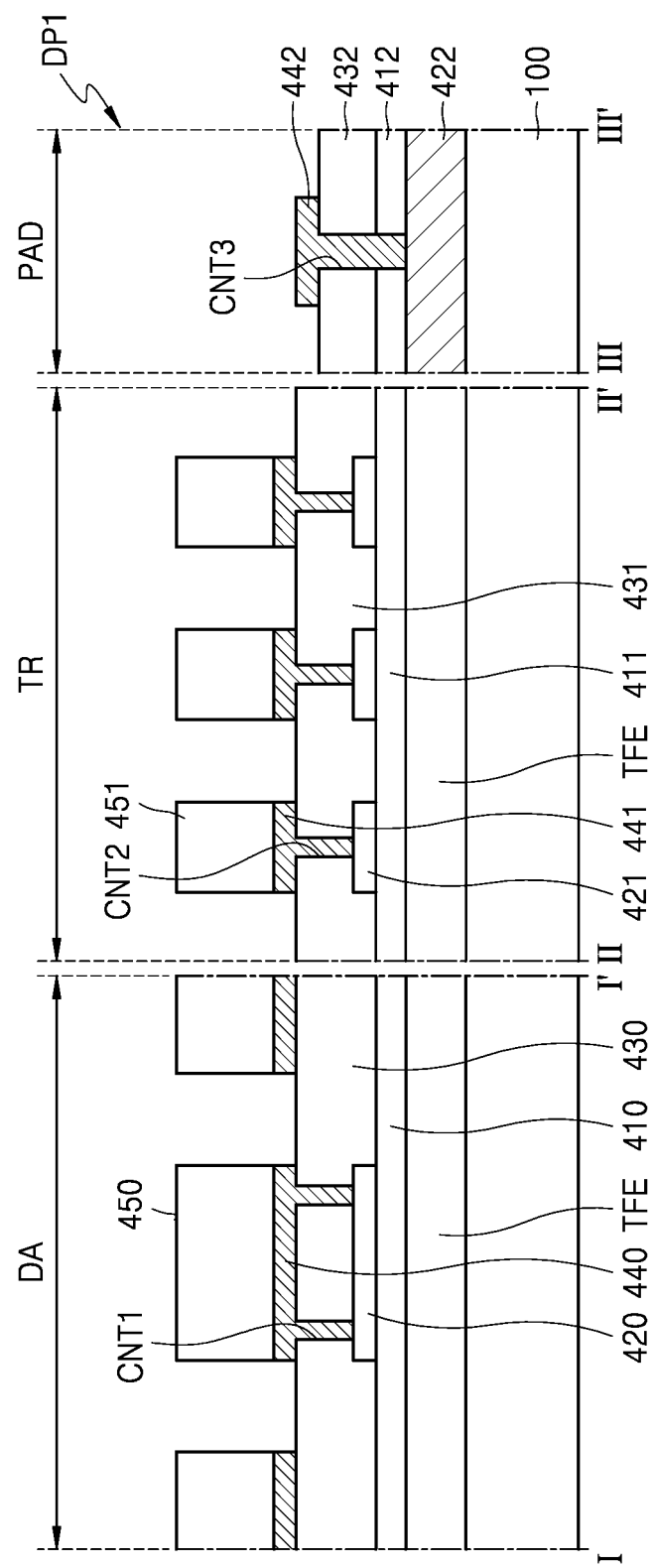

Then, as shown in FIG. 11E, the removing of the third layer 452 may be performed. Because the top conductive layer 442 in the pad area PAD may be exposed without being covered by an insulating layer, the third layer 452 formed on the top conductive layer 442 may be removed through a process of removing an insulating layer. While the third layer 452 formed on the top conductive layer 442 is removed, a portion of the second organic layer 450 formed on the second conductive layer 440, and a portion of the third layer 451 formed on the second wiring layer 441 may be removed together.

Then, referring back to FIG. 7, after the removing of the third layer 452, an operation of reflowing the second organic layer 450 such that the second organic layer 450 covers a lateral surface of the second conductive layer 440 and reflowing the third layer 451 such that the third layer 451 covers a lateral surface of the second wiring layer 441 through a curing process may be further performed. Through this operation, the second organic layer 450 may be arranged on the second conductive layer 440 such that the second organic layer 450 covers lateral surfaces and a top surface of the second conductive layer 440, and the third layer 451 may be arranged on the second wiring layer 441 such that the third layer 451 covers lateral surfaces and a top surface of the second wiring layer 441.

According to some example embodiments, as shown in FIG. 9, after the removing of the third layer 452, an operation of forming the third organic layer 460 on the second organic layer 450 and forming the fourth insulating layer 461 on the third layer 451 may be further provided. The third organic layer 460 may be arranged on the first organic layer 430 and the second organic layer 450 so as to entirely cover the first organic layer 430 and the second organic layer 450, thereby improving a passivation effect by the organic layer. Also, the fourth insulating layer 461 may be arranged on the second layer 431 and the third layer 451 so as to entirely cover the second layer 431 and the third layer 451, thereby improving a passivation effect by the organic layer.

To improve a transmittance of the display device 1, the first organic layer 430, the second organic layer 450, and the third organic layer 460 include different materials, and a refractive index of the first organic layer 430, a refractive index of the second organic layer 450, and a refractive index of the third organic layer 460 may be different from one another.

The second organic layer 453 and the third layer 454 each may include a light-blocking material, and the light-blocking material may be a black matrix. The black matrix may include various materials, for example, an organic material mixed with a black pigment, Cr or $CrO_x$. In the case where the black matrix includes Cr or $CrO_x$, the black matrix may include a single layer or a multi-layer including Cr or $CrO_x$.

In the case where the display device 1 includes a black matrix, external light reflection may be sufficiently prevented.

In a related art display device, during a strip process, an organic layer arranged between conductive layers of a touch unit may be damaged by a stripper, and the performance of the touch unit may be deteriorated. To resolve this issue, there may be provided a display device that prevents or reduces the damage of the organic layer by patterning a conductive layer using the organic layer including a photosensitive material as a photoresist, and simultaneously having an improved reliability, and a manufacturing method thereof.

According to some example embodiments, a display device that prevents or reduces the damage of the organic layer by patterning a conductive layer using the organic layer including a photosensitive material as a photoresist, and simultaneously having an improved reliability, and a manufacturing method thereof may be implemented. However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
   a substrate including a display area and a non-display area; and
   a touch unit on the substrate,
   wherein the touch unit includes:
   a first inorganic insulating layer in the display area;
   a first conductive layer on the first inorganic insulating layer;
   a first organic layer on the first conductive layer;
   a second conductive layer on the first organic layer and electrically connected to the first conductive layer through a first contact hole in the first organic layer; and
   a second organic layer on the second conductive layer so as to cover a lateral surface and a top surface of the second conductive layer and including a photosensitive material, wherein
   a refractive index of the first organic layer is different from a refractive index of the second organic layer.

2. The display device of claim 1, wherein
   the non-display area includes a wiring area and a pad area each on one side of the display area, and
   the display device further includes: a first layer in the wiring area;
   a first wiring layer on the first layer and including a same material as that of the first conductive layer;
   a second layer on the first wiring layer;
   a second wiring layer on the second layer so as to be electrically connected to the first wiring layer through a second contact hole defined in the second layer and including a same material as that of the second conductive layer; and
   a third layer on the second wiring layer so as to cover a lateral surface and a top surface of the second wiring layer and including a photosensitive material.

3. The display device of claim 2, further comprising:
   a bottom conductive layer in the pad area;
   a first layer on the bottom conductive layer;
   a second layer on the first layer; and
   a top conductive layer electrically connected to the bottom conductive layer through a third contact hole in the first layer and the second layer and including the same material as that of the second conductive layer.

4. The display device of claim 1, wherein
   the second organic layer includes a light-blocking material.

5. The display device of claim 1, further comprising:
   a light-emitting element between the substrate and the touch unit in the display area and including a pixel electrode, an opposite electrode, and an intermediate layer, the opposite electrode being over the pixel electrode, and the intermediate layer including an emission layer between the pixel electrode and the opposite electrode; and
   a thin-film encapsulation layer on the light-emitting element and including at least one inorganic encapsulation layer and at least one organic encapsulation layer.

6. The display device of claim 5, wherein the touch unit is directly on the thin-film encapsulation layer.

7. A display device comprising:
   a substrate including a display area and a non-display area; and
   a touch unit on the substrate, wherein
   the touch unit includes:
   a first inorganic insulating layer in the display area;
   a first conductive layer on the first inorganic insulating layer;
   a first organic layer on the first conductive layer;
   a second conductive layer on the first organic layer and electrically connected to the first conductive layer through a first contact hole defined in the first organic layer;
   a second organic layer on the second conductive layer so as to cover a top surface of the second conductive layer, having a lateral surface located on a same plane as a lateral surface of the second conductive layer, and including a photosensitive material; and
   a third organic layer on the second organic layer.

8. The display device of claim 7, wherein
   the non-display area includes a wiring area and a pad area each on one side of the display area,
   the display device further includes: a first layer in the wiring area;
   a first wiring layer on the first layer and including a same material as that of the first conductive layer;
   a second layer on the first wiring layer;
   a second wiring layer on the second layer so as to be electrically connected to the first wiring layer through a second contact hole defined in the second layer and including a same material as that of the second conductive layer; and
   a third layer on the second wiring layer so as to cover a top surface of the second wiring layer, having a lateral surface located on a same plane as a lateral surface of the second wiring layer, and including a photosensitive material; and
   a fourth insulating layer on the third layer.

9. The display device of claim 8, further comprising:
   a bottom conductive layer in the pad area;
   a first layer on the bottom conductive layer;
   a second layer on the first layer; and a top conductive layer electrically connected to the bottom conductive layer through a third contact hole defined in the first layer and the second layer and including a same material as that of the second conductive layer.

10. The display device of claim 7, wherein
a refractive index of the first organic layer, a refractive index of the second organic layer, and a refractive index of the third organic layer are different from one another.

11. The display device of claim 7, wherein the second organic layer includes a light-blocking material.

12. The display device of claim 7, further comprising:
a light-emitting element between the substrate and the touch unit in the display area and including a pixel electrode, an opposite electrode, and an intermediate layer, the opposite electrode being on the pixel electrode, and the intermediate layer including an emission layer between the pixel electrode and the opposite electrode; and
a thin-film encapsulation layer on the light-emitting element and including at least one inorganic encapsulation layer and at least one organic encapsulation layer.

13. The display device of claim 12, wherein the touch unit is directly on the thin-film encapsulation layer.

14. A method of manufacturing a display device, the method comprising:
preparing a substrate including a display area, a wiring area, and a pad area, the wiring area and the pad area being located one side of the display area;
forming a bottom conductive layer in the pad area;
forming a first inorganic insulating layer in the display area, a first insulating layer in the wiring area, and a first layer on the bottom conductive layer;
forming a first conductive layer on the first inorganic insulating layer, and a first wiring layer on the first layer;
forming a first organic layer on the first conductive layer, a second layer on the first wiring layer, and a second layer on the first layer;
forming a first conductive material layer on the first organic layer, a second conductive material layer on the second layer, and a third conductive material layer on the second layer;
patterning a second organic layer including a photosensitive material on the first conductive material layer, a third layer including a photosensitive material on the second conductive material layer, and a third layer including a photosensitive material on the third conductive material layer;
patterning the first conductive material layer, the second conductive material layer, and the third conductive material layer respectively using the second organic layer, the third layer, and the third layer as photoresists to form a second conductive layer, a second wiring layer, and a top conductive layer; and
removing the third layer.

15. The method of claim 14, further comprising:
after the removing of the third layer, reflowing the second organic layer such that the second organic layer covers a lateral surface of the second conductive layer, and reflowing the third layer such that the third layer covers a lateral surface of the second wiring layer through a curing process.

16. The method of claim 14, further comprising:
after the removing of the third layer, forming a third organic layer on the second organic layer and forming a fourth insulating layer on the third layer.

17. The method of claim 16, wherein a refractive index of the first organic layer, a refractive index of the second organic layer, and a refractive index of the third organic layer are different from one another.

18. The method of claim 14, wherein the second organic layer includes a light-blocking material.

19. The method of claim 14, wherein,
in the forming of the second conductive layer and the second organic layer, forming the second wiring layer and the third layer, and forming the top conductive layer and the third layer,
the second organic layer has a first thickness from a top surface of the second conductive layer and the third layer has a second thickness from a top surface of the top conductive layer, the second thickness being less than the first thickness.

* * * * *